(12) United States Patent  
Zhu

(10) Patent No.: US 7,781,278 B2
(45) Date of Patent: Aug. 24, 2010

(54) CMOS DEVICES HAVING CHANNEL REGIONS WITH A V-SHAPED TRENCH AND HYBRID CHANNEL ORIENTATIONS, AND METHOD FOR FORMING THE SAME

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 784 days.

(21) Appl. No.: 11/624,387

(22) Filed: Jan. 18, 2007

(65) Prior Publication Data
US 2008/0173901 A1   Jul. 24, 2008

(51) Int. Cl.
H01L 21/8238   (2006.01)
(52) U.S. Cl. .................. 438/199; 257/255; 257/627; 257/369; 257/E31.085
(58) Field of Classification Search .......... 438/199; 257/255, 369, 627, E31.085
See application file for complete search history.

(56) References Cited

U.S. PATENT DOCUMENTS

| | | | | | |
|---|---|---|---|---|---|
| 4,939,100 | A | * | 7/1990 | Jeuch et al. ............... | 438/297 |
| 5,808,340 | A | * | 9/1998 | Wollesen et al. .......... | 257/330 |
| 6,075,270 | A | * | 6/2000 | Okihara et al. ............. | 257/330 |
| 6,150,693 | A | * | 11/2000 | Wollesen .................. | 257/330 |
| 6,815,278 | B1 | | 11/2004 | Ieong et al. | |
| 6,830,962 | B1 | | 12/2004 | Guarini et al. | |
| 6,902,962 | B2 | | 6/2005 | Yeo et al. | |
| 6,911,383 | B2 | | 6/2005 | Doris et al. | |
| 6,946,696 | B2 | | 9/2005 | Chan et al. | |
| 2002/0185676 | A1 | * | 12/2002 | Momose .................. | 257/327 |
| 2004/0119124 | A1 | * | 6/2004 | Omi et al. ................ | 257/410 |
| 2004/0256700 | A1 | | 12/2004 | Doris et al. | |
| 2005/0045995 | A1 | | 3/2005 | Ieong et al. | |
| 2007/0181980 | A1 | * | 8/2007 | Dyer et al. ............... | 257/627 |
| 2008/0096339 | A1 | * | 4/2008 | Dyer et al. ............... | 438/199 |
| 2008/0169535 | A1 | * | 7/2008 | Butt et al. ................ | 257/622 |

(Continued)

OTHER PUBLICATIONS

O. Weber et al., "A Novel Locally Engineered (111) V-Channel pMOSFET Architecture with Improved Drivability Characteristics for Low-Standby Power (LSTP) CMOS Applications", 2005 Symposium on VLSI Technology Digest of Technical Papers, pp. 156-157.

(Continued)

*Primary Examiner*—Zandra Smith
*Assistant Examiner*—Telly D Green
(74) *Attorney, Agent, or Firm*—Scully, Scott, Murphy & Presser, P.C.

(57) ABSTRACT

The present invention relates to a field effect transistor (FET) containing a channel extending perpendicularly across at least one V-shaped trench and along the interior surfaces thereof. In one aspect, a semiconductor device is provided that includes a semiconductor substrate having first and second device regions that are isolated from each other by an isolation region. The first device region has a planar surface with a first crystalline orientation, and the second device region has at least one V-shaped trench which has interior surfaces with a second, different crystalline orientation. A first FET is located at the first device region and contains a channel extending along the planar surface of the first device region. A second, complementary FET is located at the second device region and contains a channel extending perpendicularly across the at least one V-shaped trench and along the interior surfaces thereof.

9 Claims, 46 Drawing Sheets

U.S. PATENT DOCUMENTS

2008/0303029 A1* 12/2008 Kawashima et al. .......... 257/72

OTHER PUBLICATIONS

M. Kido et al., "Vertex Channel Field Effect Transistor (VC-FET) Technology Featuring High Performance and Highly Manufacturable Trench Capacitor DRAM", 2006 Symposium on VLSI Technology Digest of Technical Papers, 2 pages.

M. Kito et al., "Vertex Channel Array Transistor (VCAT) Featuring Sub-60nm High Performance and Highly Manufacturable Trench Capacitor DRAM", 2005 Symposium on VLSI Technology Digest of Technical Papers, pp. 32-33.

* cited by examiner

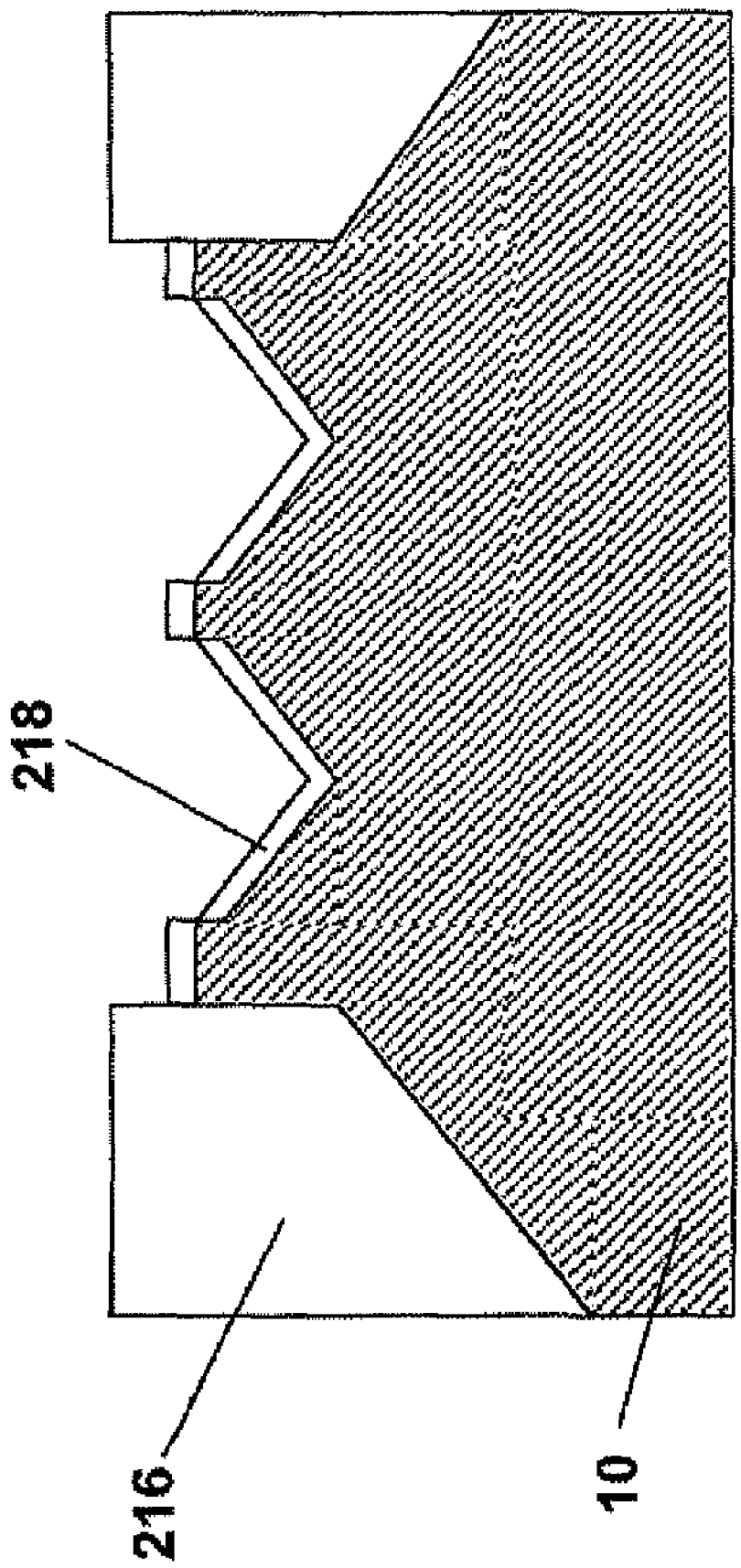

US 7,781,278 B2

CMOS DEVICES HAVING CHANNEL REGIONS WITH A V-SHAPED TRENCH AND HYBRID CHANNEL ORIENTATIONS, AND METHOD FOR FORMING THE SAME

FIELD OF THE INVENTION

The present invention relates to a field effect transistor (FET) having a channel region with at least one V-shaped trench, which can be used in complementary metal-oxide-semiconductor (CMOS) circuits. More specifically, the present invention relates to a CMOS circuit that comprises an n-channel field effect transistor (n-FET) and a p-channel field effect transistor (p-FET), either of which has a channel region with at least one V-shaped trench located therein, so that the channels of the n-FET and p-FET are characterized by different surface orientations.

BACKGROUND OF THE INVENTION

In present semiconductor technology, CMOS devices, such as n-FETs and p-FETs, are typically fabricated upon semiconductor wafers that each has a substrate surface oriented along one of a single set of equivalent crystal planes of the semiconductor material (e.g., Si) that forms the substrate. In particular, most of today's semiconductor devices are built upon silicon wafers having wafer surfaces oriented along one of the $\{100\}$ crystal planes of silicon.

Electrons are known to have a high mobility in the $\{100\}$ crystal planes of silicon, but holes are known to have high mobility in the $\{110\}$ or $\{111\}$ crystal planes of silicon. On one hand, electron mobility in the $\{110\}$ surfaces is significantly degraded compared to those in the $\{100\}$ or $\{111\}$ surfaces. On the other hand, hole mobility in the $\{110\}$ ($\{111\}$) silicon surfaces is about 2 (1.5) times higher than that along the $\{100\}$ silicon surfaces.

As can be deduced from the above, the $\{110\}$ or $\{111\}$ silicon surfaces are optimal for forming p-FET devices due to the excellent hole mobility along the $\{110\}$ planes, which leads to higher drive currents in the p-FETs. However, such surfaces are completely inappropriate for forming n-FET devices. The $\{100\}$ silicon surfaces instead are optimal for forming n-FET devices due to the enhanced electron mobility in the $\{100\}$ planes, which results in higher drive currents in the n-FETs. Correspondingly, it is desirable to provide a semiconductor substrate having different surface orientations (i.e., hybrid surface orientations) that provide optimal performance for both the n-FETs and p-FETs in the CMOS circuit.

U.S. patent application Publication No. 2004/0256700 for "HIGH PERFORMANCE CMOS SOI DEVICES ON HYBRID CRYSTAL-ORIENTED SUBSTRATES" and U.S. patent application Publication No. 2005/0045995 for "ULTRA-THIN SILICON-ON-INSULATOR AND STRAINED-SILICON-DIRECT-ON-INSULATOR WITH HYBRID CRYSTAL ORIENTATIONS" have described formation of semiconductor substrates with hybrid surface orientations by wafer bonding, etching, and selective epitaxial regrowth techniques.

However, it is difficult and expensive to use wafer bonding, etching, and selective epitaxial regrowth techniques to manufacture semiconductor substrates with hybrid surface orientations that are suitable for forming semiconductor devices with narrow channel widths, such as, for example, the metal-oxide-semiconductor field effect transistors (MOSFETs) in static random access memory (SRAM) cells. Further, the selective epitaxial growth of silicon generates dislocation defects in the silicon crystal structures, which significantly undermine the device performance.

There is therefore a continuing need for improved substrates with hybrid surface orientations that can be fabricated at reduced costs with little or no dislocation defects.

SUMMARY OF THE INVENTION

The present invention provides a semiconductor substrate with hybrid surface orientations. The semiconductor substrate of the present invention may either comprise a bulk semiconductor structure or a layered semiconductor-on-insulator (SOI) structure, which can be processed by etching steps to form at least one V-shaped channel or multiple V-shaped channels that are arranged parallel to one another, and each V-shaped channel has interior surfaces oriented along a crystal orientation that is different from the surface crystal orientation of the semiconductor substrate. Such a semiconductor substrate can be readily used to form CMOS circuits that comprise n-FETs and p-FETs with different crystalline plane orientations in their channels.

In one aspect, the present invention relates to a semiconductor device comprising:

a semiconductor substrate comprising at least first and second device regions that are isolated from each other by an isolation region, wherein the first device region has a planar surface with a first crystalline orientation, and wherein the second device region comprises at least one V-shaped trench having interior surfaces with a second, different crystalline orientation;

a first field effect transistor (FET) located at the first device region and comprising a channel that extends along the planar surface of the first device region; and a second, complementary FET located at the second device region and comprising a channel that extends perpendicularly across the at least one V-shaped trench and along the interior surfaces of the at least one V-shaped trench.

In one embodiment, the at least one V-shaped trench mentioned above includes multiple parallel oriented trenches in which each trench has interior surfaces with a second crystal orientation that differs from that of the first device region. In such an embodiment, the channel of the second, complementary FET extends perpendicularly across the multiple trenches and along interior surfaces thereof.

Preferably, but not necessarily, the first and second device regions both comprise single crystal silicon. In one specific embodiment of the present invention, the planar surface of the first device region is oriented in the $\{100\}$ planes of silicon, and the interior surfaces of the at least one V-shaped trench or multiple parallel arranged V-shaped trenches are oriented in the $\{110\}$ or $\{111\}$ planes of silicon. Correspondingly, the first FET is an n-channel FET, and the second, complementary FET is a p-channel FET. In an alternative embodiment of the present invention, the planar surface of the first device region is oriented along the $\{110\}$ or $\{111\}$ planes of silicon, and the interior surfaces of the at least one V-shaped trench or the multiple parallel arranged V-shaped trenches are oriented along the $\{100\}$ planes of silicon. Correspondingly, the first FET is a p-channel FET, and the second, complementary FET is an n-channel FET.

The semiconductor substrate of the present invention may comprise either a bulk semiconductor or a semiconductor-on-insulator (SOI).

The first and second device regions are spaced apart from each other by a distance (Wt). When multiple parallel arranged V-shaped trenches are present, each of the parallel arranged V-shaped trenches at the second device region has a trench width (Wv). The parallel arranged V-shaped trenches are spaced apart from each other by a distance (Wf). Preferably, but not necessarily, Wt>Wv>Wf.

In another aspect of the present invention, a semiconductor device is provided that comprises:

at least one semiconductor substrate including a device region containing at least one V-shaped trench having interior surfaces; and a field effect transistor (FET) located at the device region and comprising a channel that extends perpendicularly across the at least one V-shaped trench and along the interior surfaces of said at least one V-shaped trench, said FET including source and drain contacts that are located at the at least one V-shaped trench and along the interior surfaces of the at least one V-shaped trench.

In one embodiment, the device region comprises single crystal silicon, wherein said interior surfaces of the at least one V-shaped trench are oriented in the {100} or {110} or {111} crystalline planes of silicon, wherein said FET is a p-channel FET. In another embodiment, the device region comprises single crystal silicon, wherein said interior surfaces of the at least one V-shaped trench are oriented in the {100} or {110} or {111} crystalline planes of silicon, wherein said FET is a n-channel FET. In a further embodiment, the dopant concentration of the device near the top part of the at least one V-shaped trench is different from that near the bottom of said at least one V-shaped trench.

In yet another aspect, the present invention relates to a method for forming a semiconductor device, comprising:

forming a semiconductor substrate comprising first and second device regions that are isolated from each other by an isolation region, wherein the first device region has a planar surface with a first crystalline orientation, and wherein the second device region comprises at least one V-shaped trench or multiple parallel arranged V-shaped trenches, each of which has interior surfaces with a second, different crystalline orientation;

forming a first field effect transistor (FET) at the first device region, wherein the first FET comprises a channel that extends along the planar surface of the first device region; and forming a second, complementary FET at the second device region, wherein said second FET comprises a channel that extends perpendicularly across the V-shaped trench or multiple parallel arranged V-shaped trenches and along the interior surfaces of the V-shaped trenches.

The isolation region between the first and second device regions may comprise an insulator structure having a rectangular bottom portion, or a V-shaped bottom portion.

In a specific embodiment of the present invention, the isolation region is formed by anisotropic etching of the semiconductor substrate along a direction that is perpendicular to the substrate surface to form an isolation trench having a rectangular bottom, followed by filling the isolation trench with an insulator material to form an insulator structure having a rectangular bottom portion. The at least one V-shaped trench or the multiple parallel arranged V-shaped trenches can be formed at the second device region after formation of the isolation structure by crystallographic etching. The term "crystallographic etching" as used herein refers to an etching process that etches the semiconductor substrate along the first crystal orientation at a rate faster than along the second, different crystal orientation, thereby forming V-shaped trenches that terminate at surfaces defined by the second, different crystal orientation. On one hand, the second device region can be protected by dielectric mask structures and SiGe structures during the anisotropic etching of the semiconductor substrate, and the SiGe structures are selectively removed relative to the dielectric mask structures after the anisotropic etching, but before the crystallographic etching. On the other hand, the first device region can be protected by a dielectric mask structure during both the anisotropic etching and the crystallographic etching.

In another embodiment of the present invention, the isolation region is formed by crystallographic etching, which forms an isolation trench having a V-shaped bottom, followed by filling the isolation trench with an insulator material to form an insulator structure having a V-shaped bottom portion. Preferably, the at least one V-shaped trench or the multiple parallel arranged V-shaped trenches are concurrently formed at the second device region by the crystallographic etching before filling of the isolation trench. The first device region is protected by a dielectric mask structure during the crystallographic etching. The isolation trench at the isolation region can be deepened by subsequent anisotropic etching before filling of the isolation trench, while the second device region is protected by dielectric mask structures and SiGe structures during the subsequent anisotropic etching, so that the at least one V-shaped trench or the multiple parallel arranged V-shaped trenches are not deepened.

Other aspects, features and advantages of the invention will be more fully apparent from the ensuing disclosure and appended claims.

DETAILED DESCRIPTION OF THE INVENTION

Figure 1:
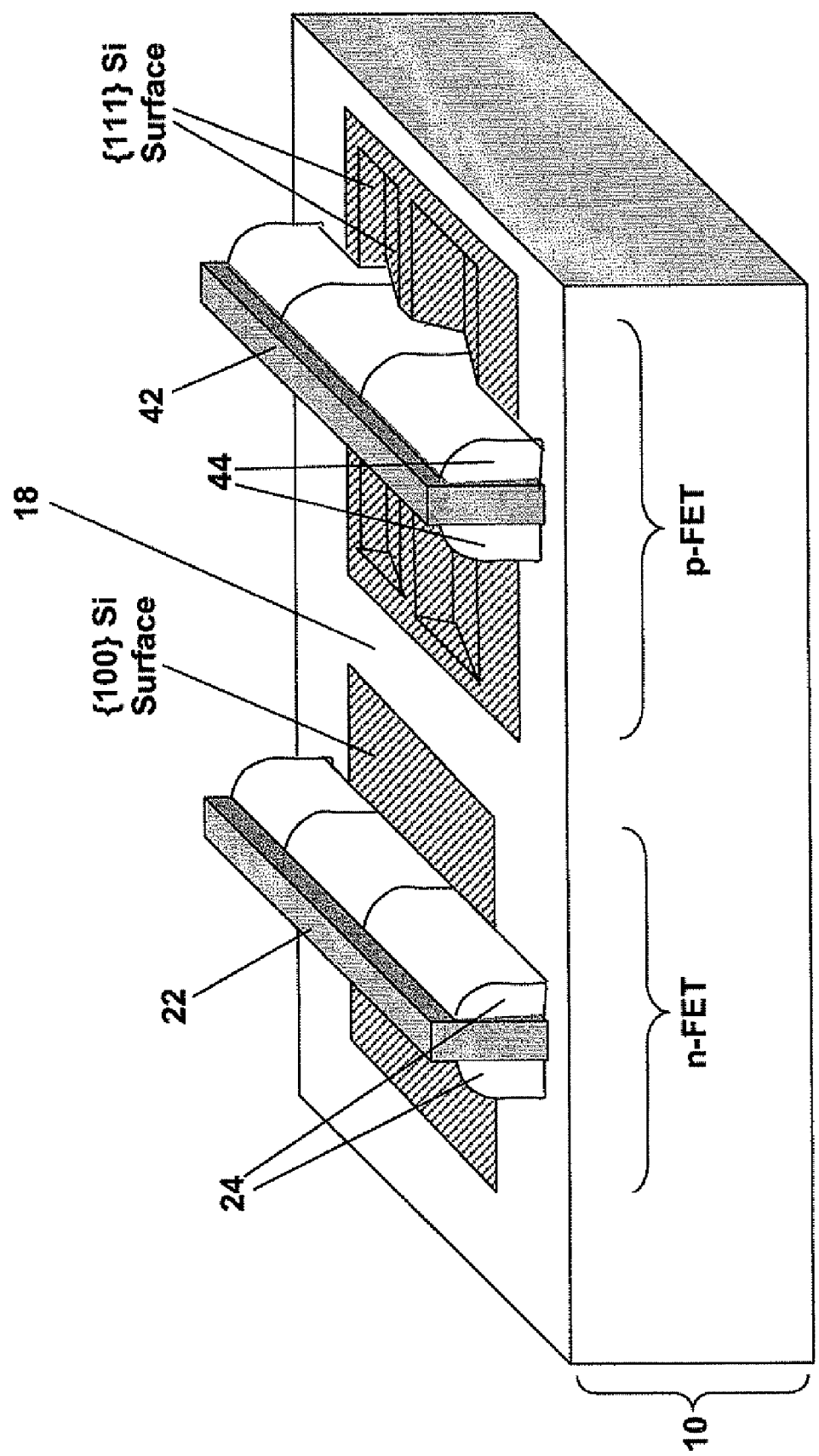
FIG. 1 is an elevated view of an exemplary complementary metal-oxide-semiconductor (CMOS) device structure comprising an n-FET device region with a planar surface having the {100} orientation and a p-FET device region containing multiple parallel arranged V-shaped trenches with interior surfaces having the {111} orientation, according to one embodiment of the present invention.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides hybrid semiconductor substrates that contain a first active region with a planar surface having a first crystal orientation and a second device region containing one V-shaped trench or multiple parallel arranged V-shaped trenches with interior surfaces having a second, different crystalline orientation. More specifically, the mobility of a first type of charge carriers (i.e., electrons or holes) is enhanced along the first crystalline orientation, and the mobility of a second, different type of charge carries (i.e., holes or electrons) is enhanced or degraded along the second, different crystalline orientation.

It is observed that the following discussion is provided for an embodiment of the present invention in which multiple parallel arranged V-shaped trenches are used. Although such an embodiment is shown and illustrated, the present invention is not limited to such an embodiment. For example, the present invention can be practiced in embodiments where a single V-shaped trench is used. The single V-shaped trench is formed utilizing the basic processing steps described herein below. Also, a single device region including the at least one V-shaped trench is also contemplated.

In an aspect of this invention, a first FET (i.e., either an n-channel FET or a p-channel FET) can be formed at the first device region, which has a channel that extends along the planar surface of the first device region. The device performance of the first FET is improved or degraded due to the enhanced or reduced mobility of the first type of charge carries (i.e., electrons or holes) along the first crystalline orientation in the channel of the first FET. A second, complementary FET (i.e., either a p-channel or an n-channel FET) can be formed at the second device region, which has a channel that extends across the multiple parallel arranged V-shaped trenches and along the interior surfaces of the V-shaped trenches. The device performance of the second, complementary FET is also improved or degraded due to the enhanced or reduced mobility of the second, different type of charge carries (i.e., holes or electrons) along the second, different crystalline orientation in the channel of the second, complementary FET.

The gate structure of the second, complementary FET, which defines the channel of the second, complementary FET, extends across the at least one V-shaped trench or the multiple parallel arranged V-shaped trenches. In this manner, the gate structure or channel of the second, complementary FET does not have to be aligned longitudinally with any one of the V-shaped trenches, which lowers the alignment requirements during the gate fabrication process and thereby reduces the manufacturing complexity. Further, the gate or channel length of the second, complementary FET is not limited by, and may be multiple times greater than, the width of a single V-shaped trench. Therefore, the gate or channel length of the second, complementary FET can be readily adjusted to achieve better device performance, especially for high performance MOSFETs with very short gate length such as deep sub-micro MOSFETs.

FIG. 1 shows an elevated view of an exemplary complementary metal-oxide-semiconductor (CMOS) device structure, which comprises a semiconductor substrate 10 including a first, n-FET device region with a planar surface and a second, p-FET device region containing multiple parallel arranged V-shaped trenches.

The semiconductor substrate 10 may comprise any single crystal semiconductor material, which includes, but is not limited to: Si, SiC, SiGe, SiGeC, Ge alloys, GaAs, InAs, InP, as well as other III-V or II-VI compound semiconductors. Preferably, such a semiconductor substrate 10 is composed of a Si-containing semiconductor material, i.e., a semiconductor material that includes silicon. For example, the semiconductor substrate 10 may consist essentially of bulk single crystal silicon. Alternatively, the semiconductor substrate 10 may comprise a SOI structure that contains a thin single crystal silicon layer located over a buried insulator layer, which functions to reduce the leakage current in the substrate. The semiconductor substrate 10 may be doped, undoped or contain both doped and undoped regions therein. For example, the semiconductor substrate 10 may also include a first doped (n- or p-) region and a second doped (p- or n-) region.

In some embodiments, the first doped layer can be used to adjust local threshold voltage near a top part of the V-shaped trenches and the second doped layer to adjust local threshold voltage (independently to the first doped layer) near the bottom of the V-shaped trenches. Such an embodiment is helpful for obtaining uniform threshold voltages in the entire channel. The first doped region and the second doped region (not shown) may be the same, or they may have different conductivities and/or doping concentrations. These doped regions (not shown) are known as "wells" and can be used to define various device regions.

In a particularly preferred (but not necessary) embodiment of the present invention, the semiconductor substrate 10 comprises single crystal silicon. The planar surface of the first, n-FET device region therefore may be oriented along the {100} planes of silicon, while the interior surfaces of the multiple parallel arranged V-shaped trenches at the second, p-FET device region may be oriented along the {111} planes of silicon, as shown in FIG. 1. Alternatively, the interior surfaces of the V-shaped trenches at the second, p-FET device region may be oriented along the {110} planes of silicon. Further, the first device region may be a p-FET device region with a planar surface oriented along the {110} planes of silicon, while the second device region may be an n-FET device region with multiple parallel arranged V-shaped trenches having interior surfaces oriented along the {111} or {100} planes of silicon.

In this manner, the semiconductor substrate 10 of the present invention can be used for fabricating a CMOS circuit, which comprises at least one n-FET with a gate conductor 22 (on (100) plane and along <110> direction) and gate dielectric spacers 24 extending across the planar surface of the first, n-FET device region and at least one p-FET with a gate conductor 42 (along <110> direction) and gate dielectric spacers 44 extending across the interior surfaces of the V-shaped trenches at the second, p-FET device region, as shown in FIG. 1. Such gate structures of the n-FET and p-FET, respectively, define the channels of the n-FET and p-FET, which extend respectively along the planar surface at the first, n-FET device region and the interior surfaces of the V-shaped trenches at the second, p-FET device region. The source and drain regions of the n-FET (not shown) are located at the first, n-FET device region and, respectively, at opposite sides of the gate conductor 22 and the gate dielectric spacers 24. The source and drain regions of the p-FET (not shown) are located at the second, p-FET device region and, respectively, at opposite sides of the gate conductor 42 and the gate dielectric spacers 44.

At least one isolation region can be provided in the semiconductor substrate 12 to isolate the first, n-FET device region from the second, p-FET device region. The isolation region may be a trench isolation region 18, as shown in FIG. 1, or a field oxide isolation region (not shown). The trench isolation region 18 can be readily formed utilizing a conventional trench isolation process well known to those skilled in the art. For example, lithography, etching and filling of the trench with a trench dielectric may be used in forming the trench isolation region 18. Optionally, a liner may be formed in the trench prior to trench fill, a densification step may be performed after the trench fill and a planarization process may follow the trench fill as well. The field oxide may be formed utilizing a so-called local oxidation of silicon process.

Note that while FIG. 1 illustratively demonstrates an exemplary CMOS device structure according to a specific embodiment of the present invention, it is clear that a person ordinarily skilled in the art can readily modify such an exemplary device structure for adaptation to specific application requirements, consistent with the above descriptions. For example, while the semiconductor substrate 10 as shown in FIG. 1 comprises an n-FET device region with a planar surface and a p-FET device region with multiple V-shaped trenches, it should be appreciated that the semiconductor substrate 10 may alternatively comprise a p-FET device region with a planar surface and an n-FET device region with multiple V-shaped trenches. For another example, while the semiconductor substrate shown in FIG. 1 represents a bulk semiconductor substrate, it should be appreciated that a semiconductor-on-insulator (SOI) substrate can also be used for practice of the present application. Further, while the {100} and {111} crystal planes of single crystal silicon are primarily illustrated by FIG. 1 for defining the channel orientations of the n-FET and the p-FET devices, other suitable crystal planes, such as the {111}, {211}, {311}, {511}, and {711} planes of single crystal silicon, can also be used in any suitable combination for defining the channel orientations of the p-FET and n-FET devices. Moreover, other single crystal semiconductor substrate materials with non-cubic unit cells, such as single crystal gallium nitride having hexagonal unit cells, can also be used for fabricating the CMOS devices of the present invention, as long as such other single crystal semiconductor materials contain different sets of crystal planes that have different carrier mobility values. A person ordinarily skilled in the art can readily modify the device structure illustrated in FIG. 1 for adaptation to other substrate structures, crystal orientations, or semiconductor materials, consistent with the spirit and principles of the present invention.

Semiconductor substrates with hybrid surface orientations, as described hereinabove, can be readily formed by selective crystallographic etching. Specifically, a semiconductor substrate with a substrate surface oriented along one of a first specific set of equivalent crystal planes (e.g., the {100}, {110}, or {111} planes of silicon) is first provided. A first region on the substrate surface is then selectively protected by a masking structure, while a second region on the substrate surface is selectively etched by a crystallographic etching process to form multiple parallel arranged V-shaped trenches having interior surfaces oriented along a second, different set of equivalent crystal planes. The crystallographic etching process etches the semiconductor substrate along all directions, but the etching rate along the first set of equivalent crystal planes is faster than that along the second, different set of equivalent crystal planes. In this manner, the crystallographic etching terminates at the second, different set of equivalent crystal planes, thereby forming V-shaped trenches.

The crystallographic etching is preferably carried out by one or more wet-etching processes, which employ etching solutions, such as ammonia-based etching solutions, hydroxide-based etching solutions (e.g., tetra-methyl ammonium hydroxide or TMAH), or ethylene diamine pyrocatechol (EDP)-based etching solutions. These wet-etching processes typically etch the semiconductor substrate along all directions, but with a crystallographic selectivity, i.e., it etches different crystal planes or orientations at significantly different etching rates (which are referred to herein as "crystallographic etching"). Therefore, the etch pattern formed by a crystallographic etching process proceeds along the fast-etched crystal planes and is eventually terminated by the slowly etched crystal planes.

After formation of the multiple V-shaped trenches at the second region on the semiconductor substrate, the masking structure is then removed from the first region, followed by additional CMOS processing steps to form an n-FET and p-FET at the first and second regions. The gate structures of the n-FET and p-FET are arranged and constructed in such a manner that the channel of the n-FET (which is defined by the n-FET gate structure) extends across the planar surface of the first region, and the channel of the p-FET (which is defined by the p-FET gate structure) extends across the interior surfaces of the multiple V-shaped trenches at the second region. Correspondingly, the respective carrier mobility in the n-FET channel or the p-FET channel is enhanced.

FIGS. 2-13 illustrate exemplary processing steps for forming a CMOS device similar to that in FIG. 1, according to one embodiment of the present invention.

Figure 2:
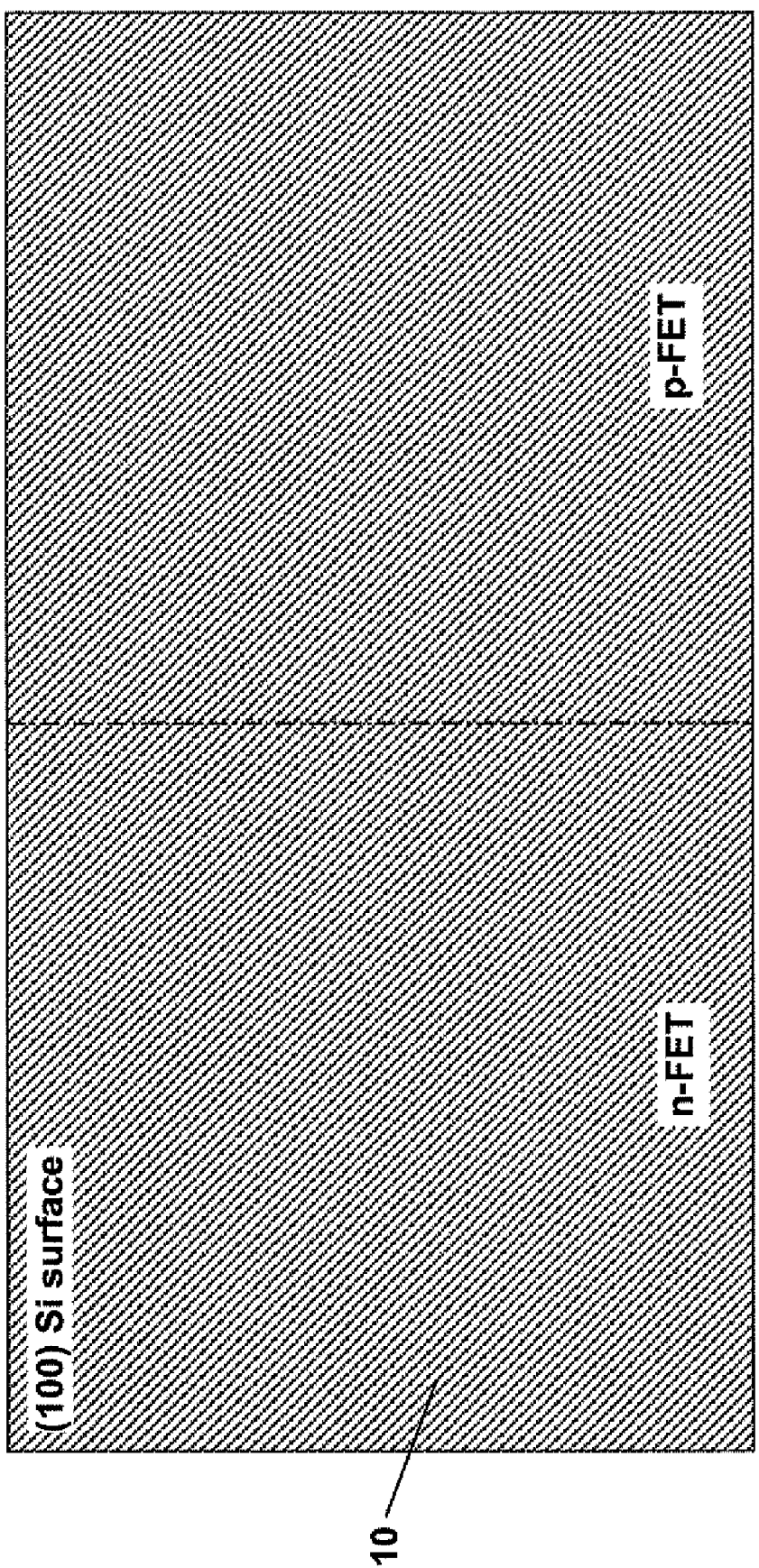
FIGS. 2-13 illustrate exemplary processing steps for forming a CMOS device similar to that in FIG. 1, according to one embodiment of the present invention.

Reference is first made to FIG. 2, which shows a semiconductor substrate 10, preferably a silicon-containing substrate, with an upper surface oriented along the {100} planes of silicon, as described hereinafter. The semiconductor substrate 10 may have a bulk semiconductor configuration or an SOI configuration, as described hereinabove. There are at least two device regions on the surface of the semiconductor substrate 10, including, for example, an n-FET device region at the left side and a p-FET device region at the right side.

Figure 3A:
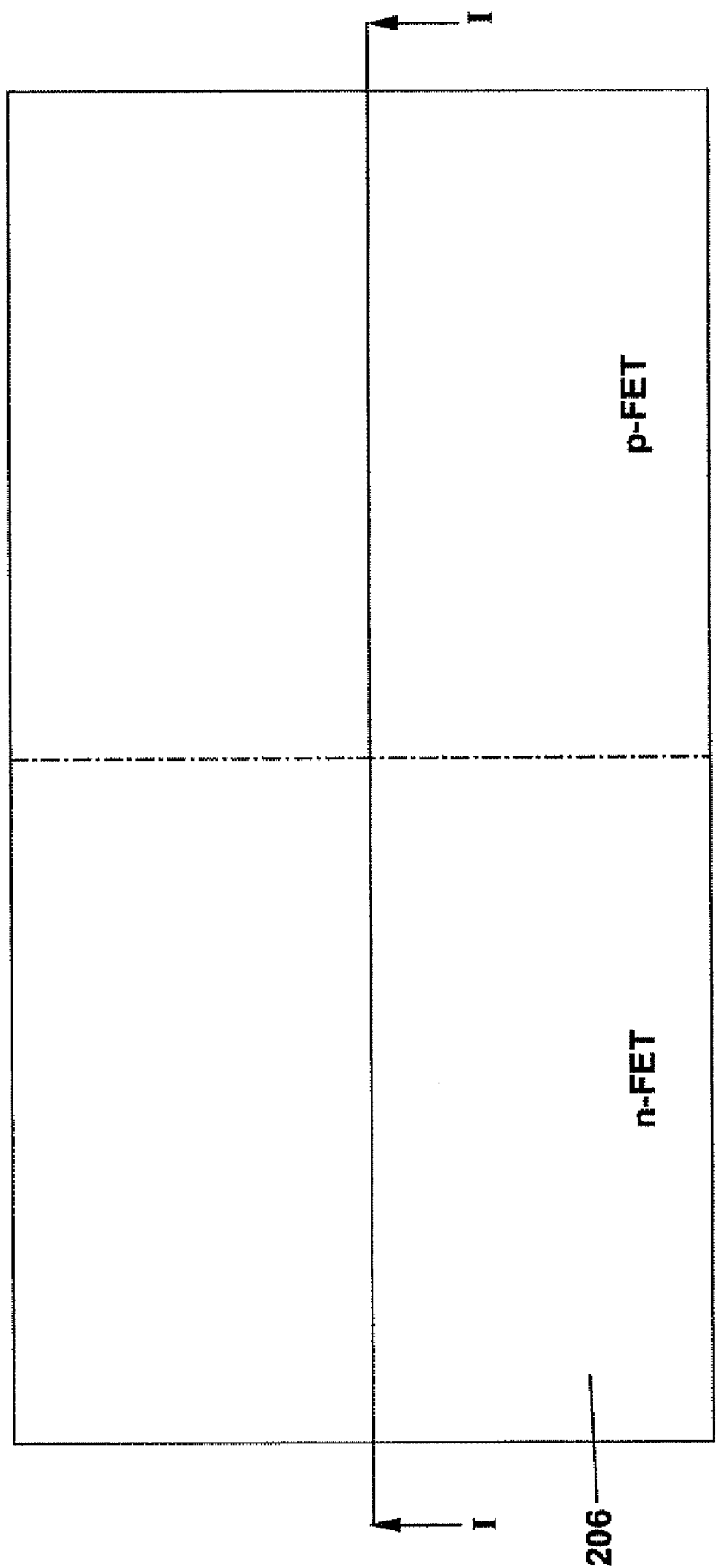
Figure 3B:
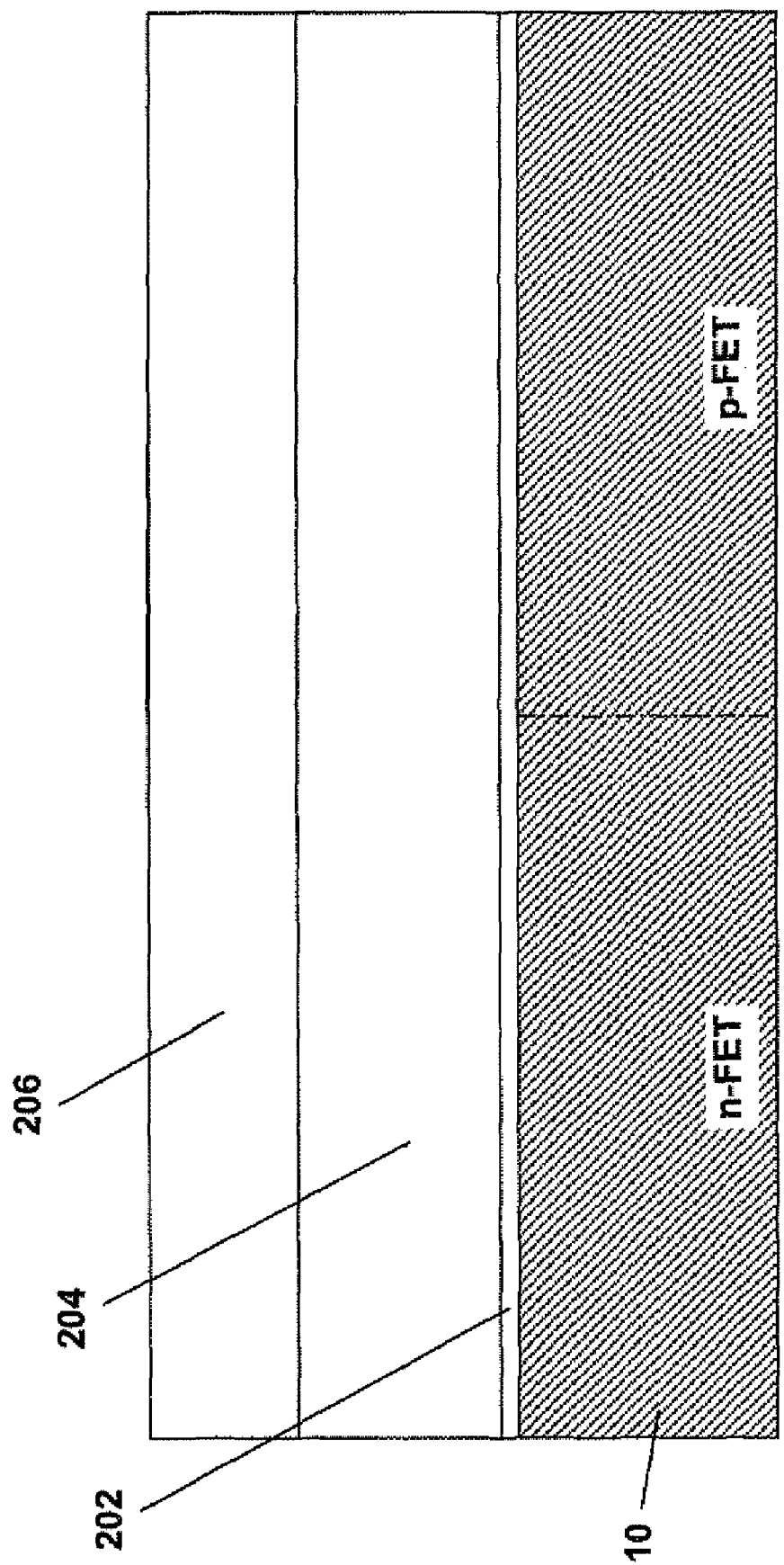

A thin pad oxide layer 202, a nitride layer 204, and an oxide cap layer 206 are then deposited over the upper {100} surface of the semiconductor substrate 10. The layers 202, 204, and 206 conjunctively form a masking structure to cover both the n-FET and the p-FET device regions. FIG. 3A shows a top view of the masking structure after deposition of the oxide cap layer 206, while FIG. 3B shows a cross-section view of the layered masking structure along line I-I in FIG. 3A.

Figure 4A:
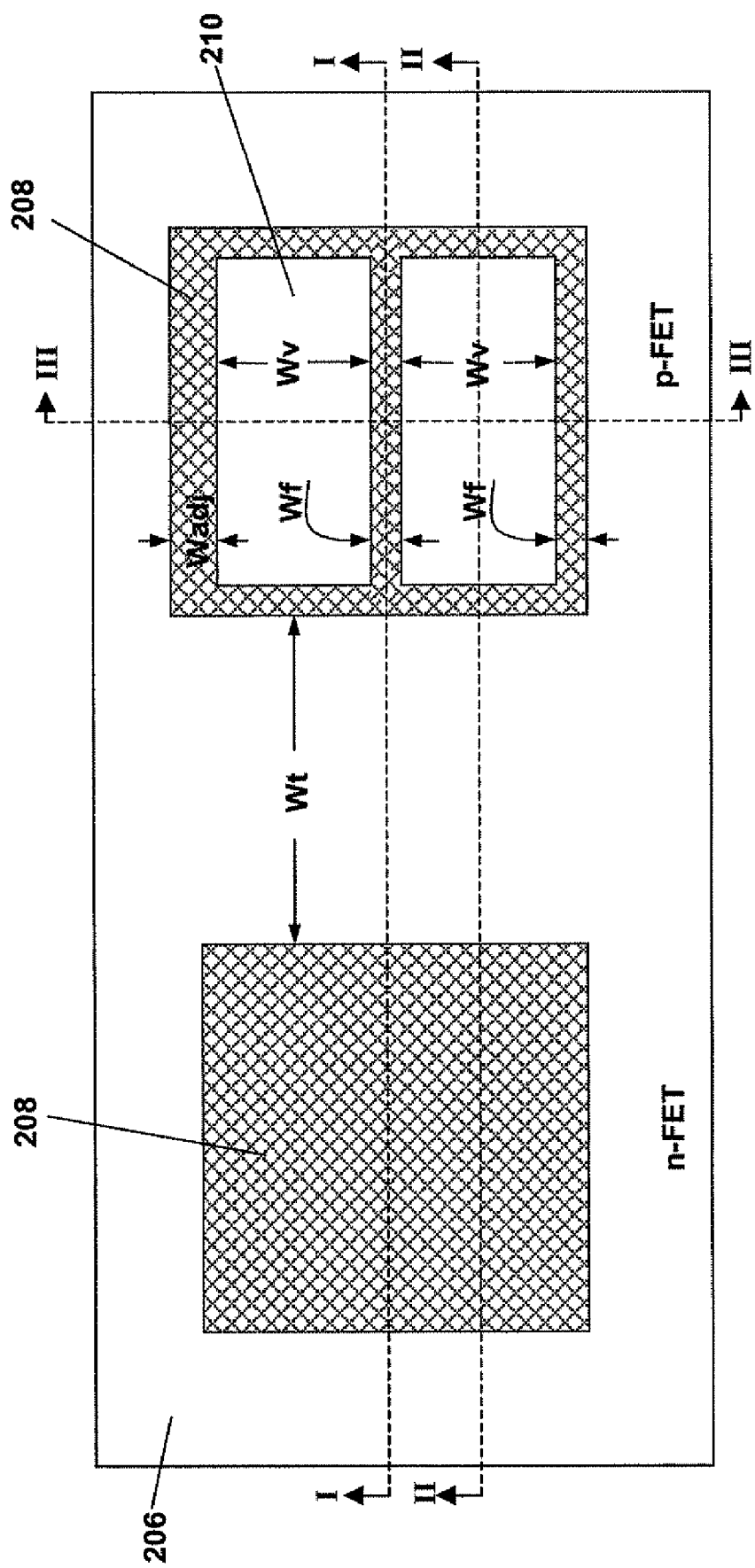
Figure 4B:
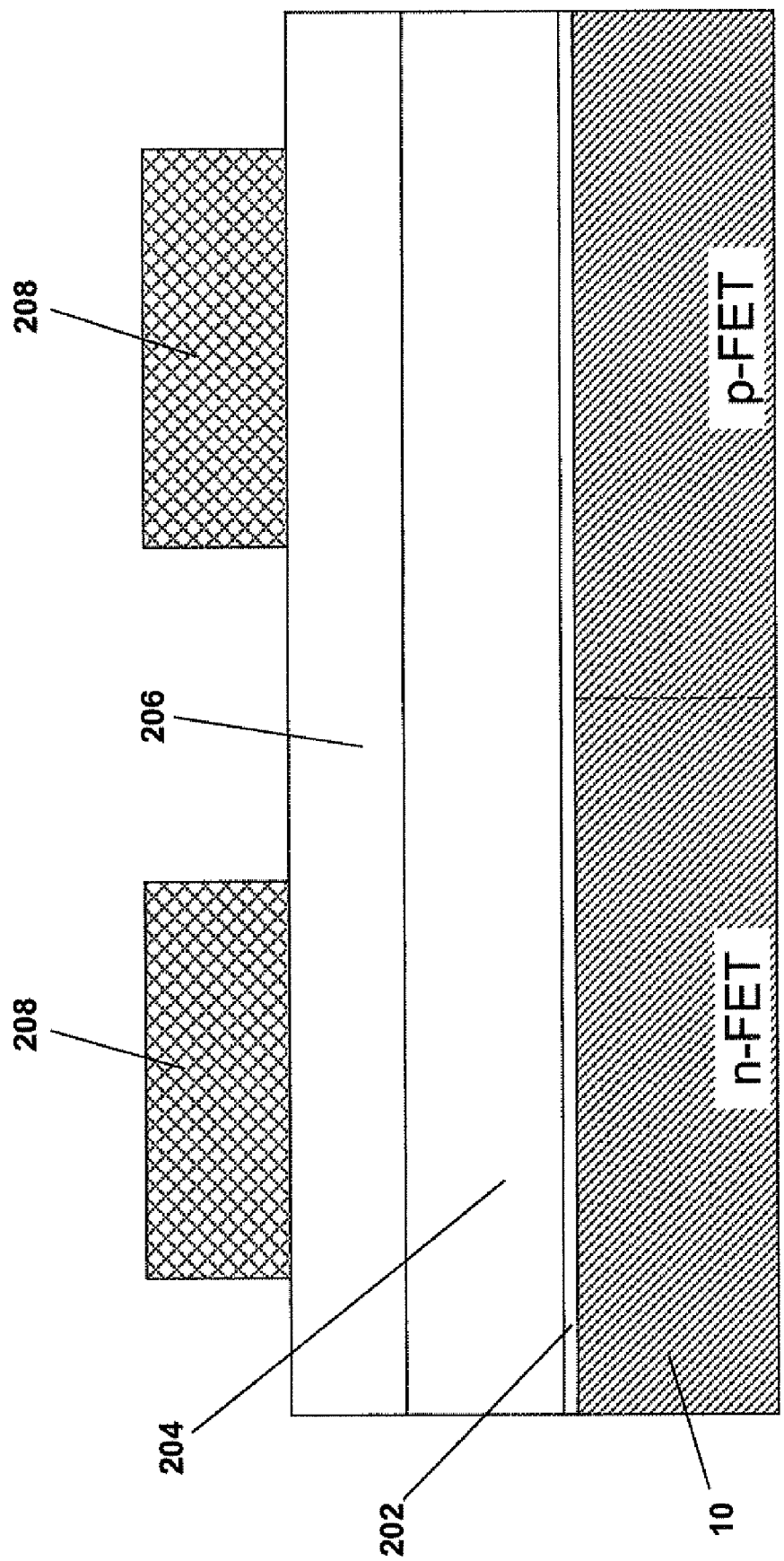
Figure 4C:
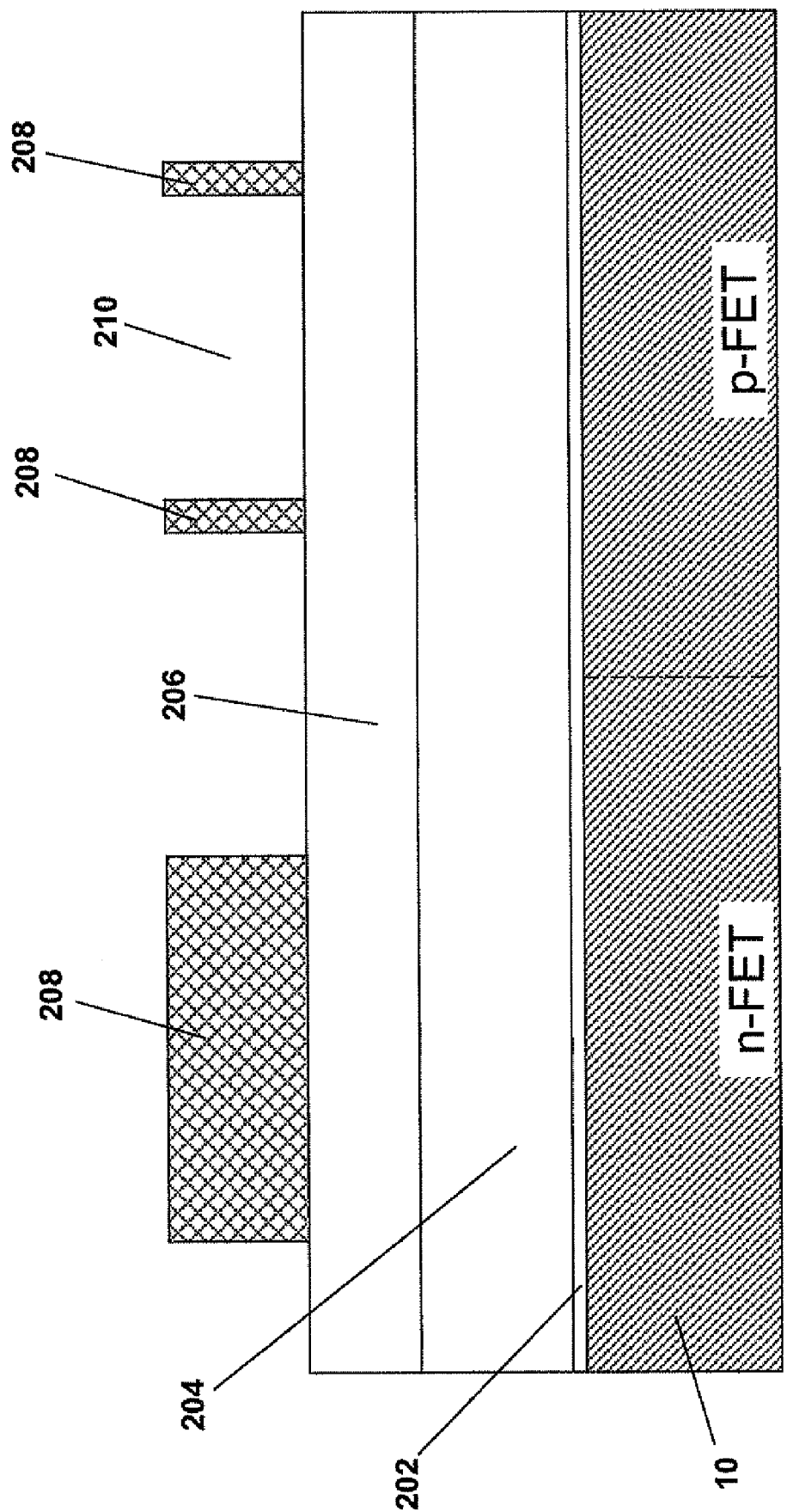
Figure 4D:
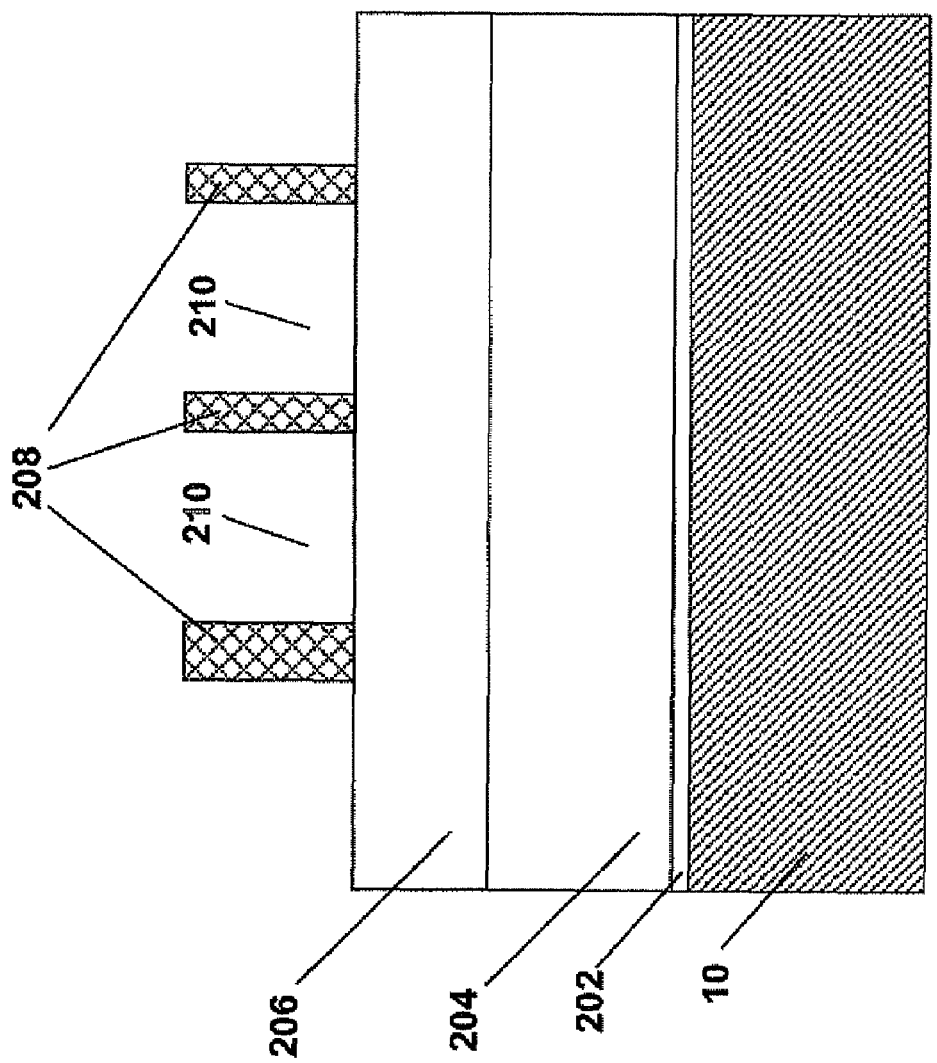

Next, a patterned photoresist layer 208 is formed over the masking structure by conventional lithography and photoresist development techniques to cover the active regions for the n-FET and the p-FET, as shown in FIG. 4A. On one hand, the active region for the n-FET is completely protected by the patterned photoresist layer 208. On the other hand, the active region for the p-FET is only partially protected by the patterned photoresist layer 208, which defines multiple parallel arranged trenches 210 at the p-FET device region. The n-FET active region and the p-FET active region are spaced apart from each other by a distance Wt, which defines the width of the isolation to be formed between the n-FET and p-FET active device regions. Each of the parallel arranged trenches 210 has a trench width Wv, which is preferably the minimum printing spacing allowed by conventional photolithography technology (typically about 50-100 nm). The multiple trenches 210 are spaced apart from each other by a distance Wf, which is preferably the minimum printing critical dimension (CD) allowed by conventional photolithography technology. More preferably, Wt>Wv>Wf. Further, the p-FET active region may include a trench-free adjustable section, which has a width Wadj and allows free adjustment of the p-FET active area to match the n-FET active area. FIGS. 4B, 4C, and 4D show the cross-sectional view of the structure in FIG. 4A along lines I-I, II-II, and III-III, respectively.

One or more reactive ion etching (RIE) steps are then carried out using the patterned photoresist layer 208 as a mask to pattern the oxide cap layer 206 and the nitride layer 204, followed by stripping of the patterned photoresist layer 208 to expose the remaining oxide cap layer 206, as shown in FIG.

Figure 5A:
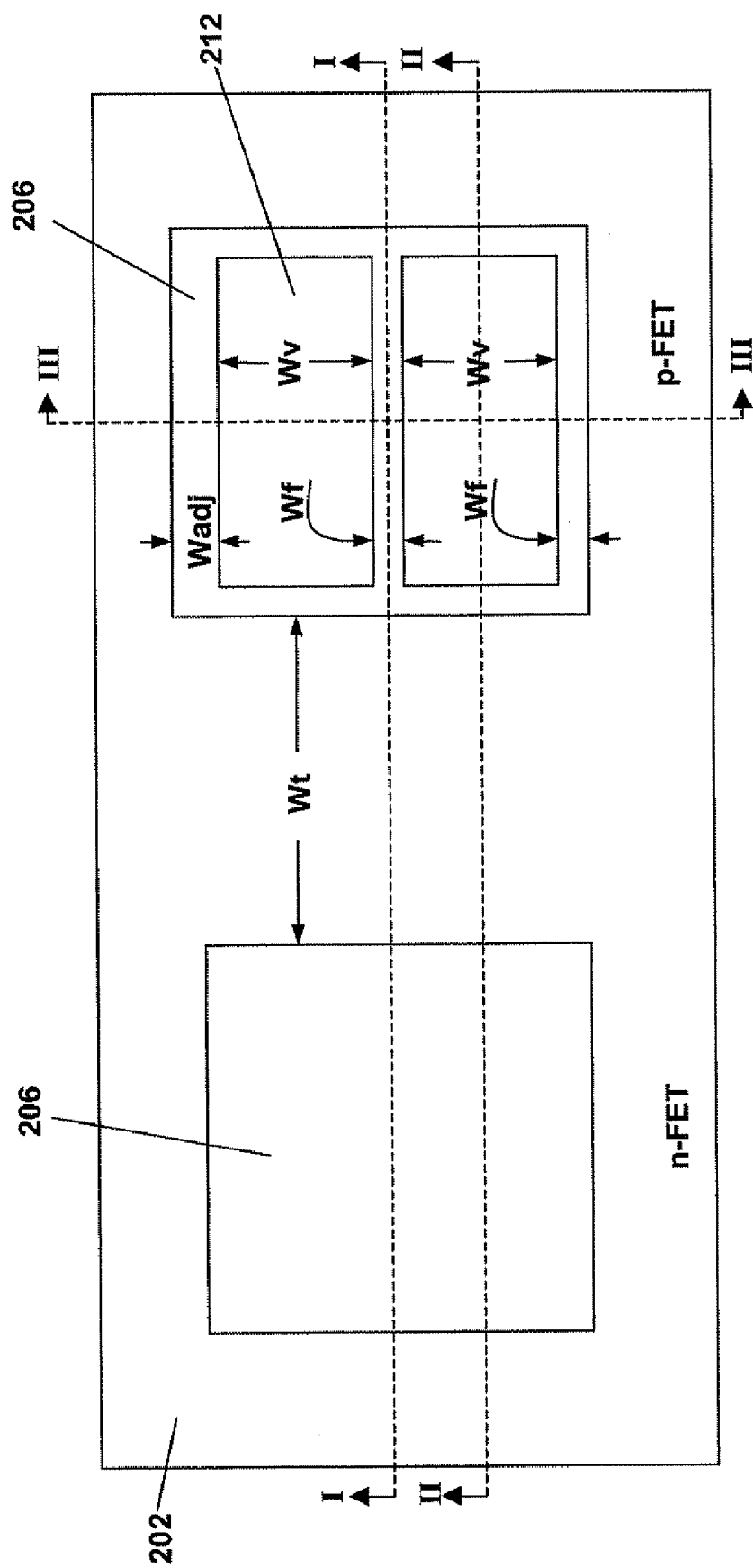
Figure 5B:
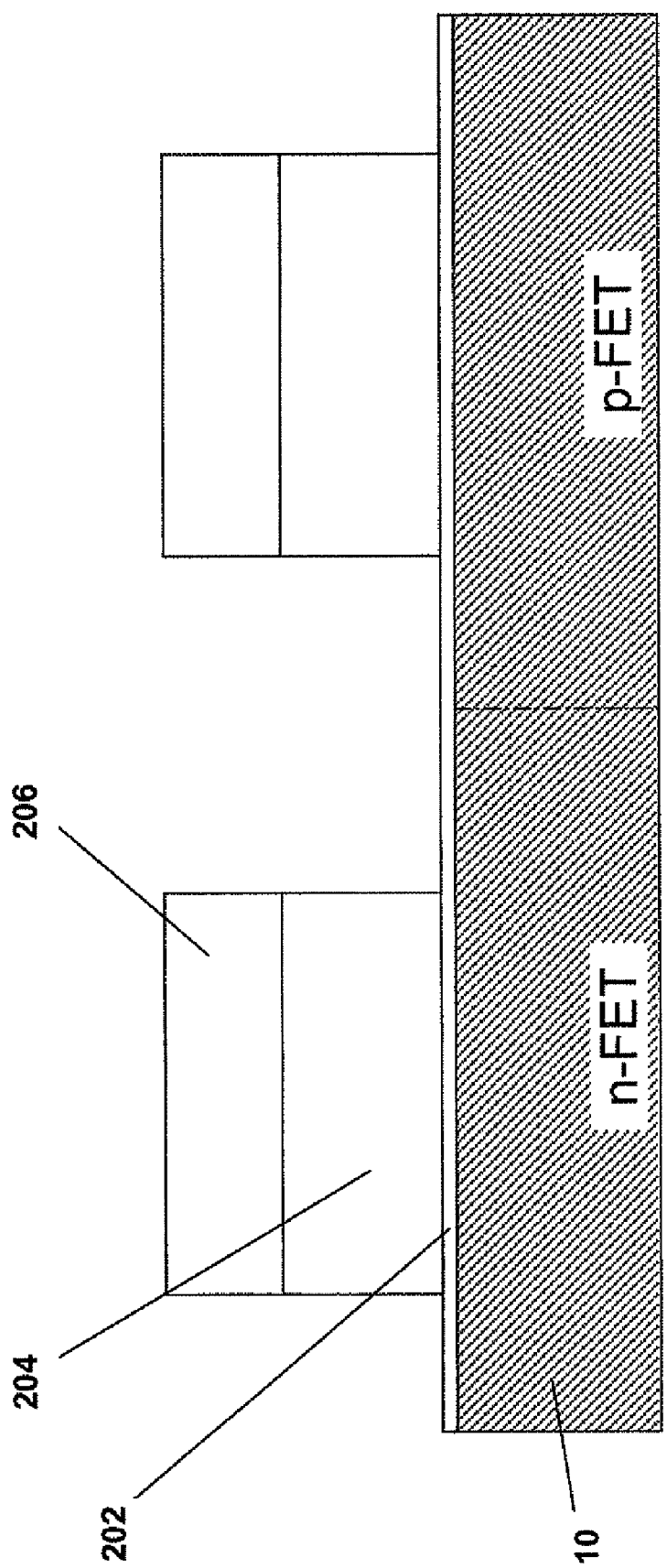
Figure 5C:
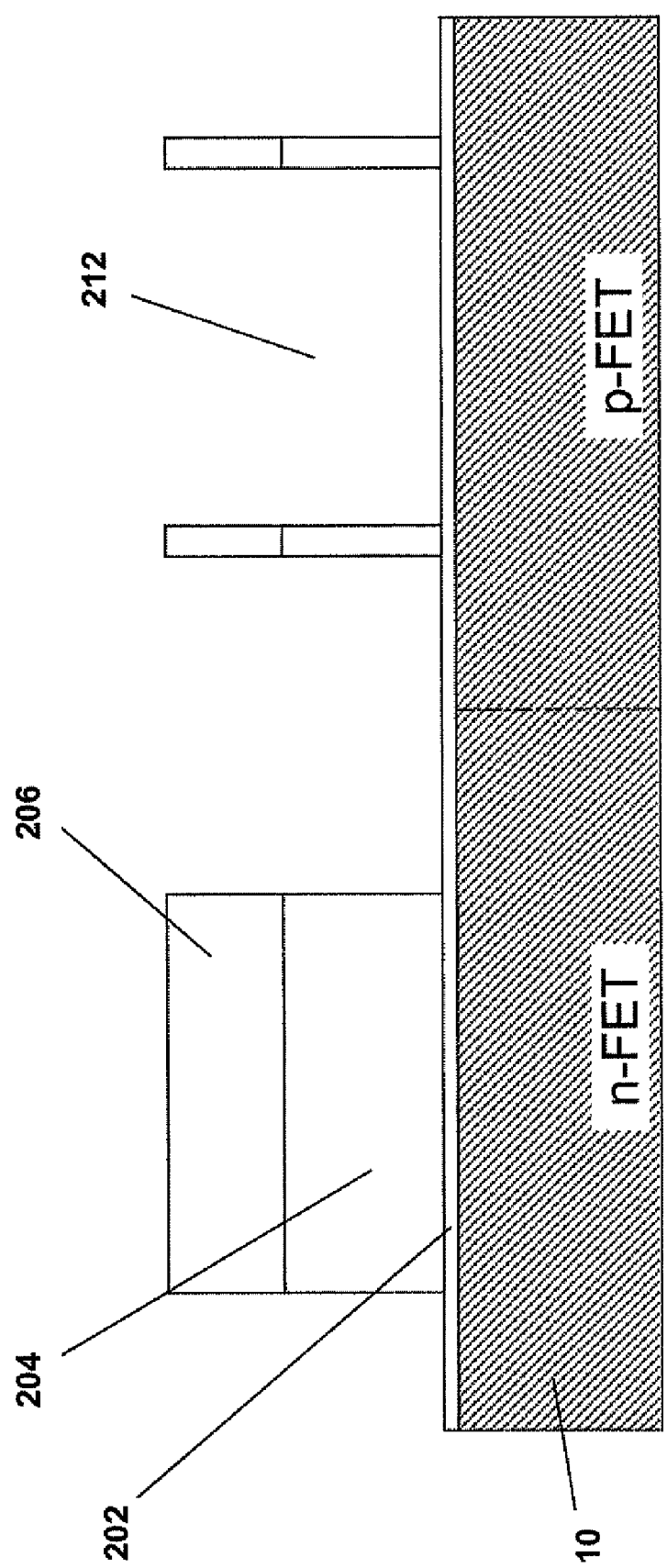
Figure 5D:
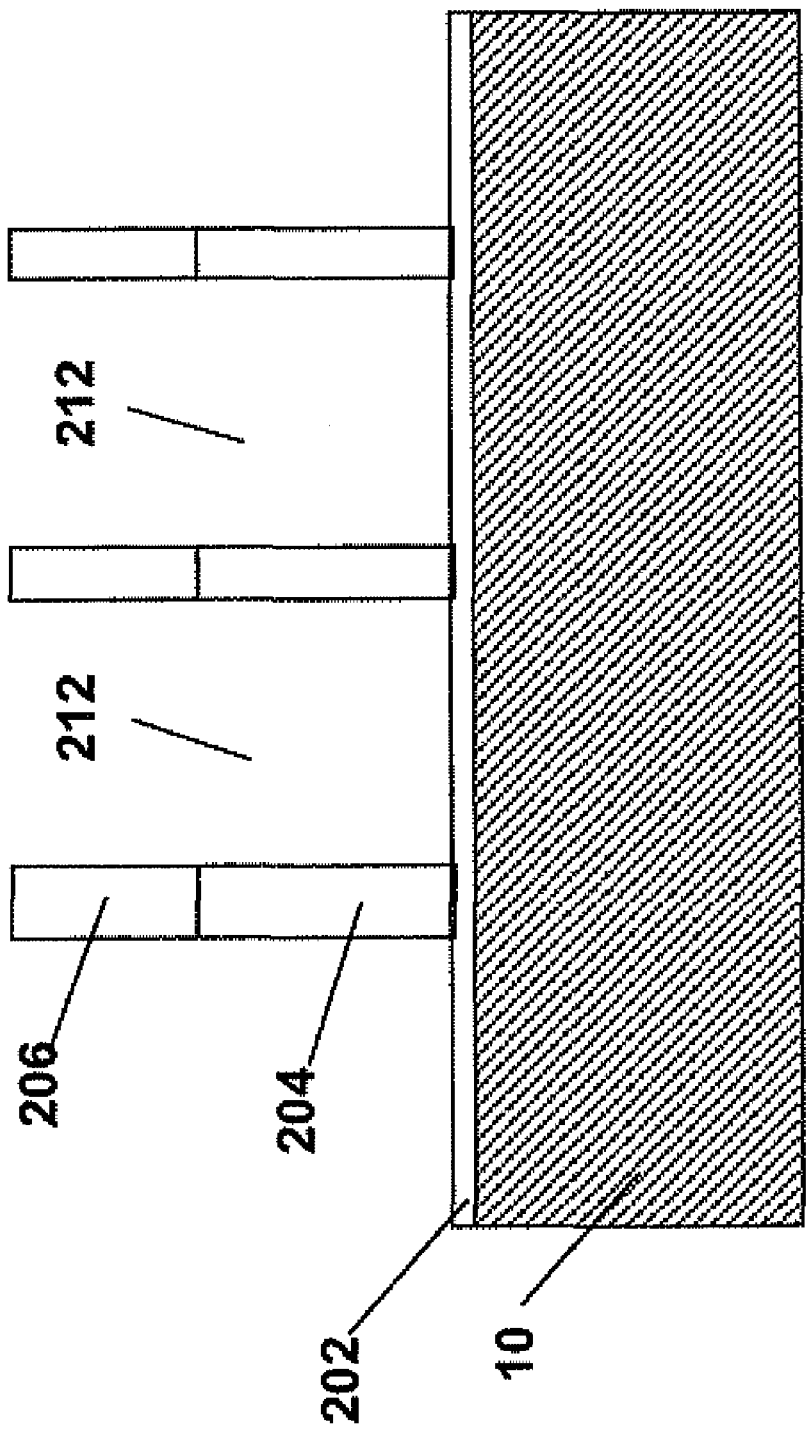

5A. Correspondingly, a patterned mask structure comprising the patterned oxide cap layer 206 and the patterned nitride layer 204 is formed. On one hand, the patterned mask structure completely covers the n-FET active region on the left. On the other hand, the patterned mask structure only partially covers the p-FET active region on the right, thereby defining multiple parallel arranged trenches 212 that are aligned with the trenches 210 in FIG. 4A. FIGS. 5B, 5C, and 5D show the cross-sectional view of the structure in FIG. 5A along lines I-I, II-II, and III-III, respectively.

Figure 6A:
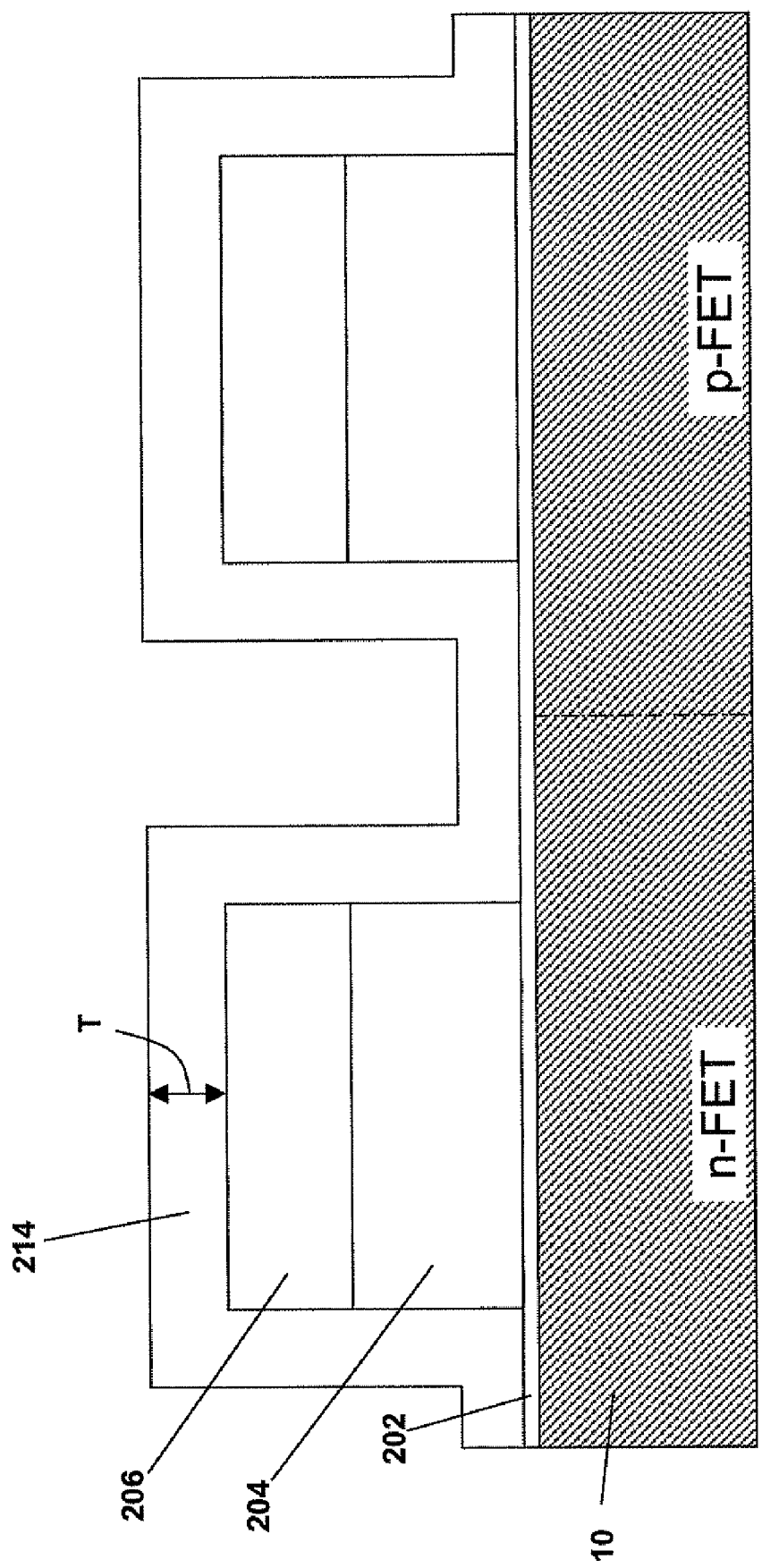
Figure 6B:
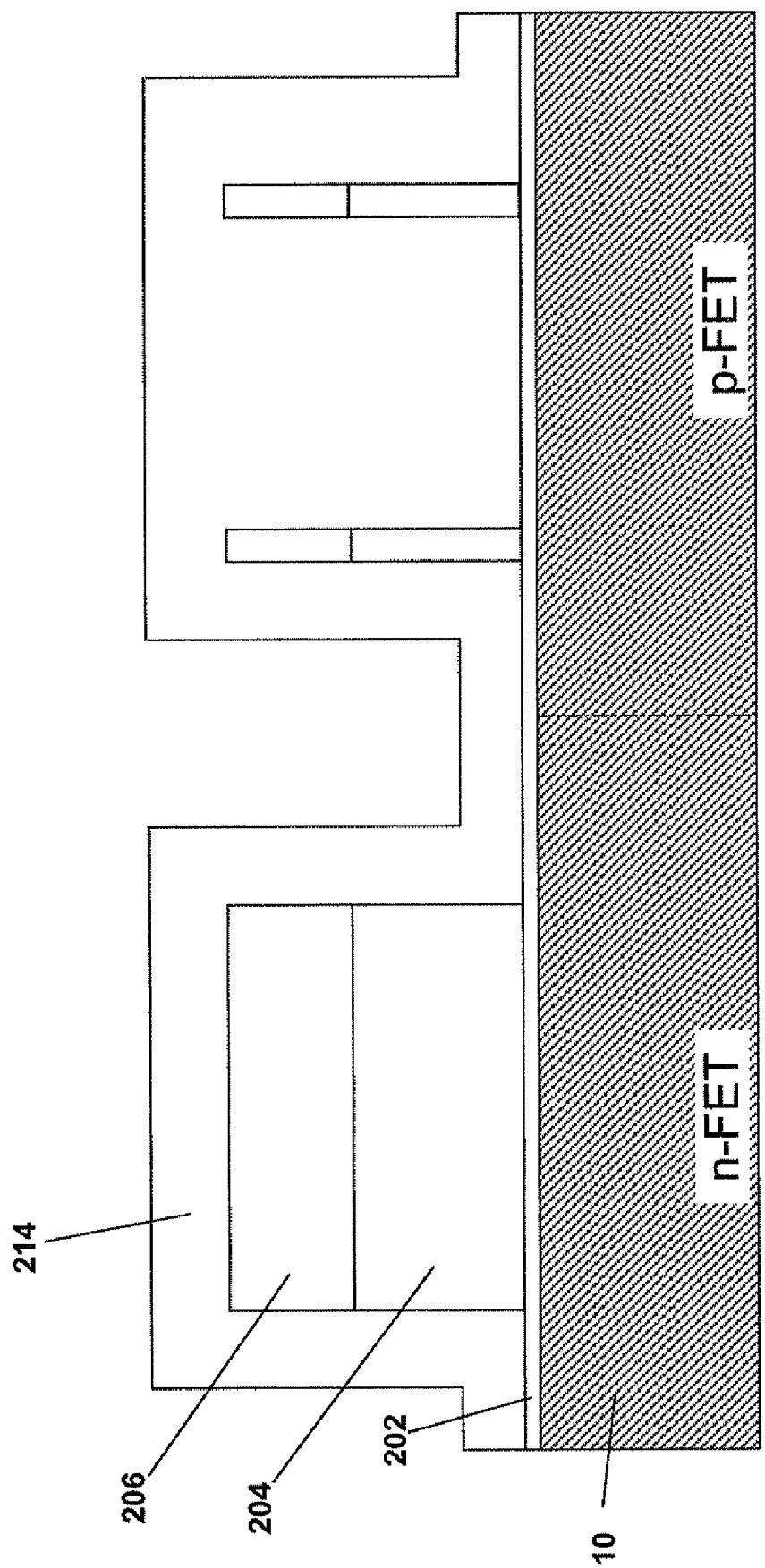
Figure 6C:
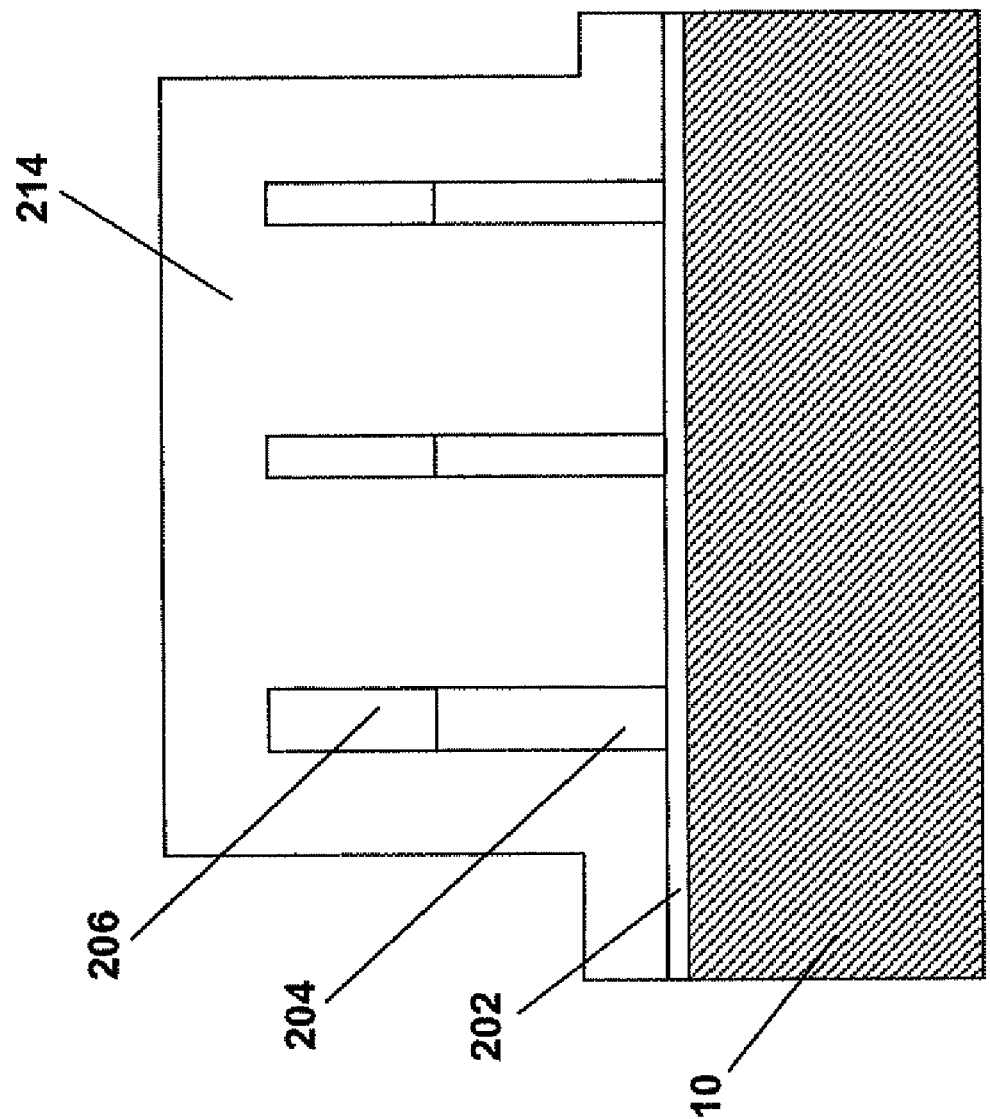

A conformal silicon germanium (SiGe) layer 214 is deposited over the structure in FIGS. 5A-5D. Preferably, the SiGe layer 214 has a thickness T, which is preferably more than ½ of the width Wv of the parallel arranged trenches 212 at the p-FET region, but is preferably less than ½ of the distance Wt between the n-FET region and the p-FET region. In this manner, the trenches 212 at the p-FET region are completely filled by the SiGe layer 214, but the gap between the n-FET and p-FET regions is preserved, as shown in FIGS. 6A-6C, which correspond to the cross-sectional views of the structure in FIGS. 5B-5D after deposition of the SiGe layer 214.

Figure 7A:
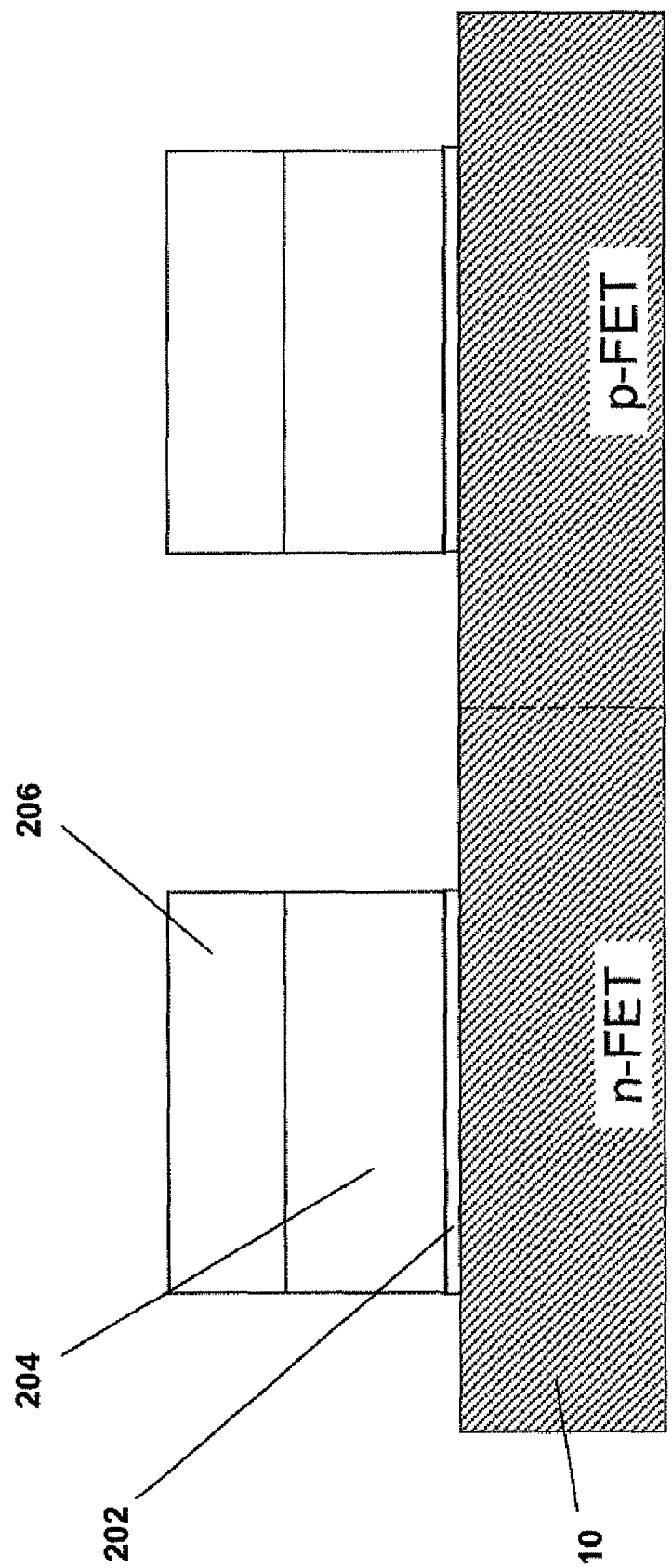
Figure 7B:
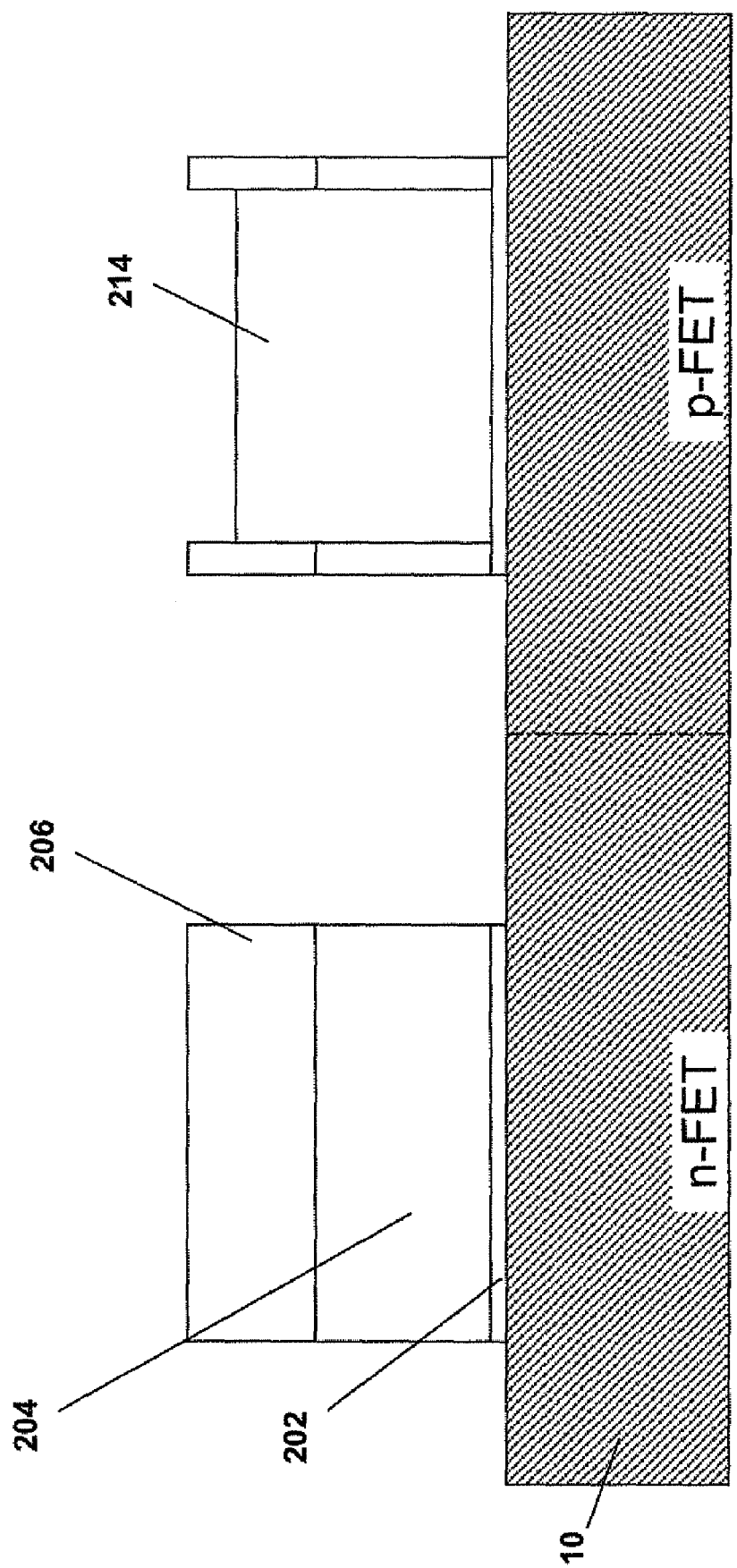
Figure 7C:
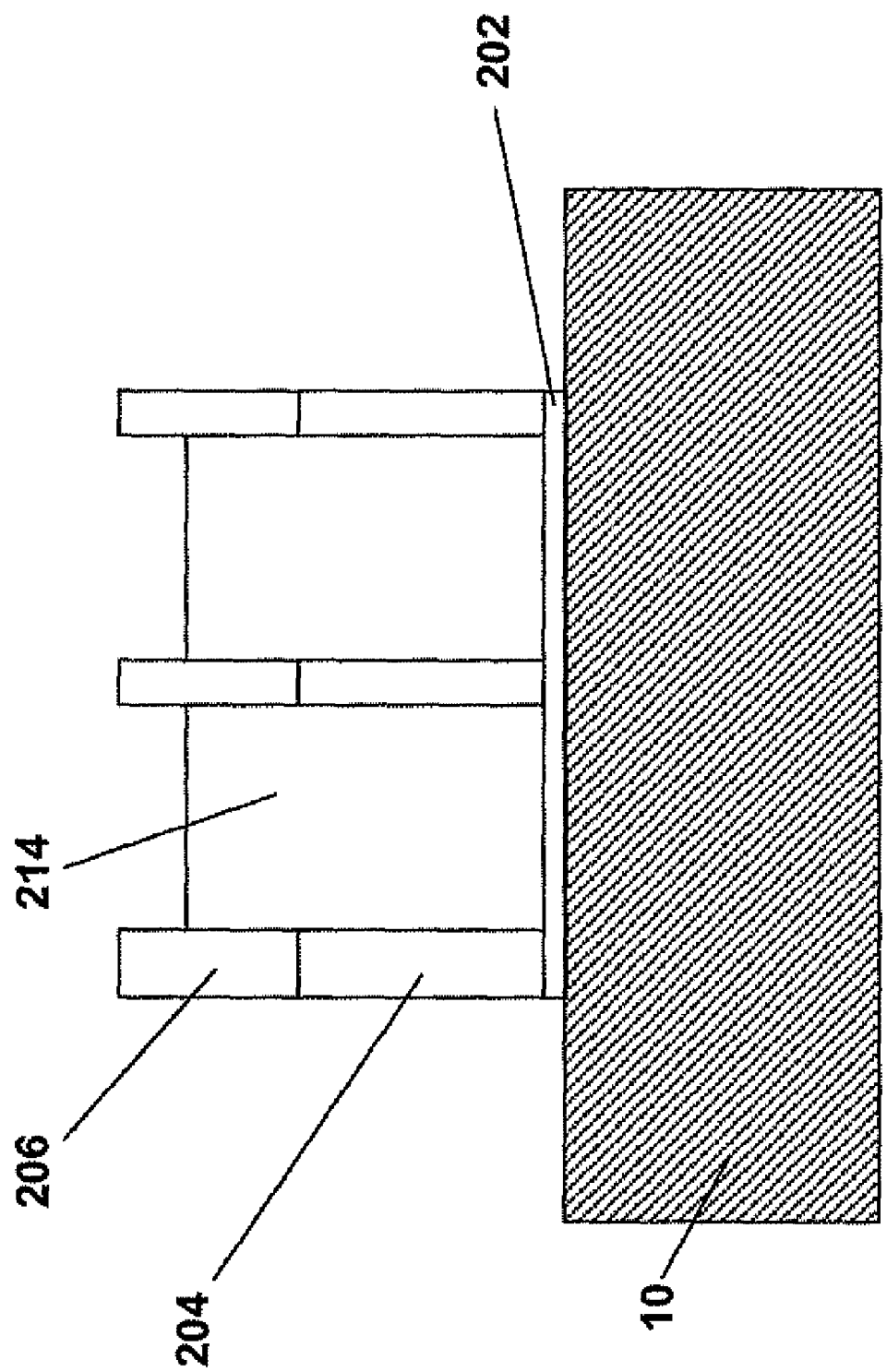

The SiGe layer 214 is then etched back in such a manner that the portion of the SiGe layer 214 located in the trenches at the p-FET region is recessed but not completely removed, while the remaining portion of the SiGe layer 214 located outside the trenches at the p-FET region is completely removed to expose the underlying thin pad oxide layer 202. Next, a RIE step is carried out to selectively remove the exposed thin pad oxide layer 202 from the semiconductor substrate 10, as shown in FIGS. 7A-7C.

Figure 8A:
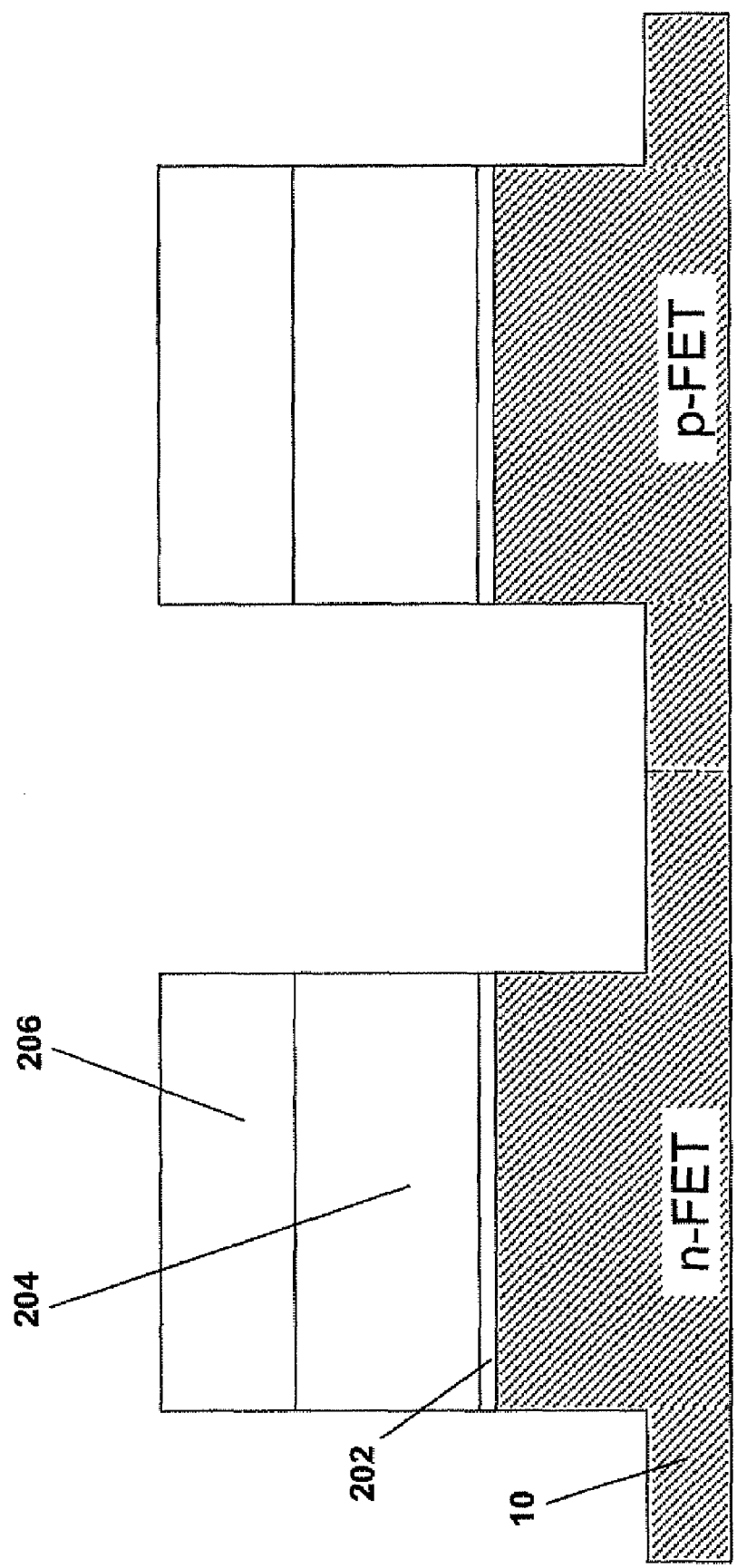
Figure 8B:
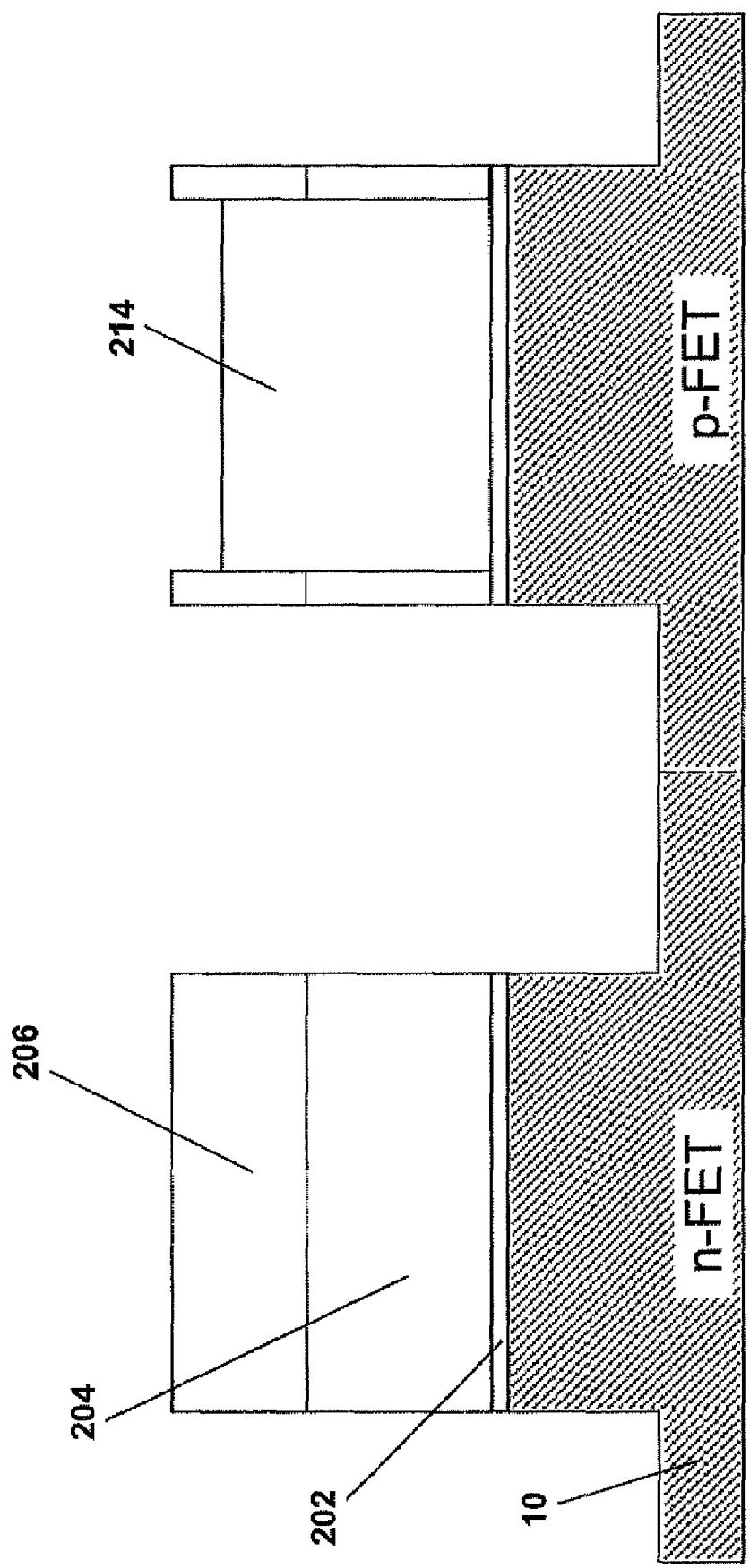
Figure 8C:
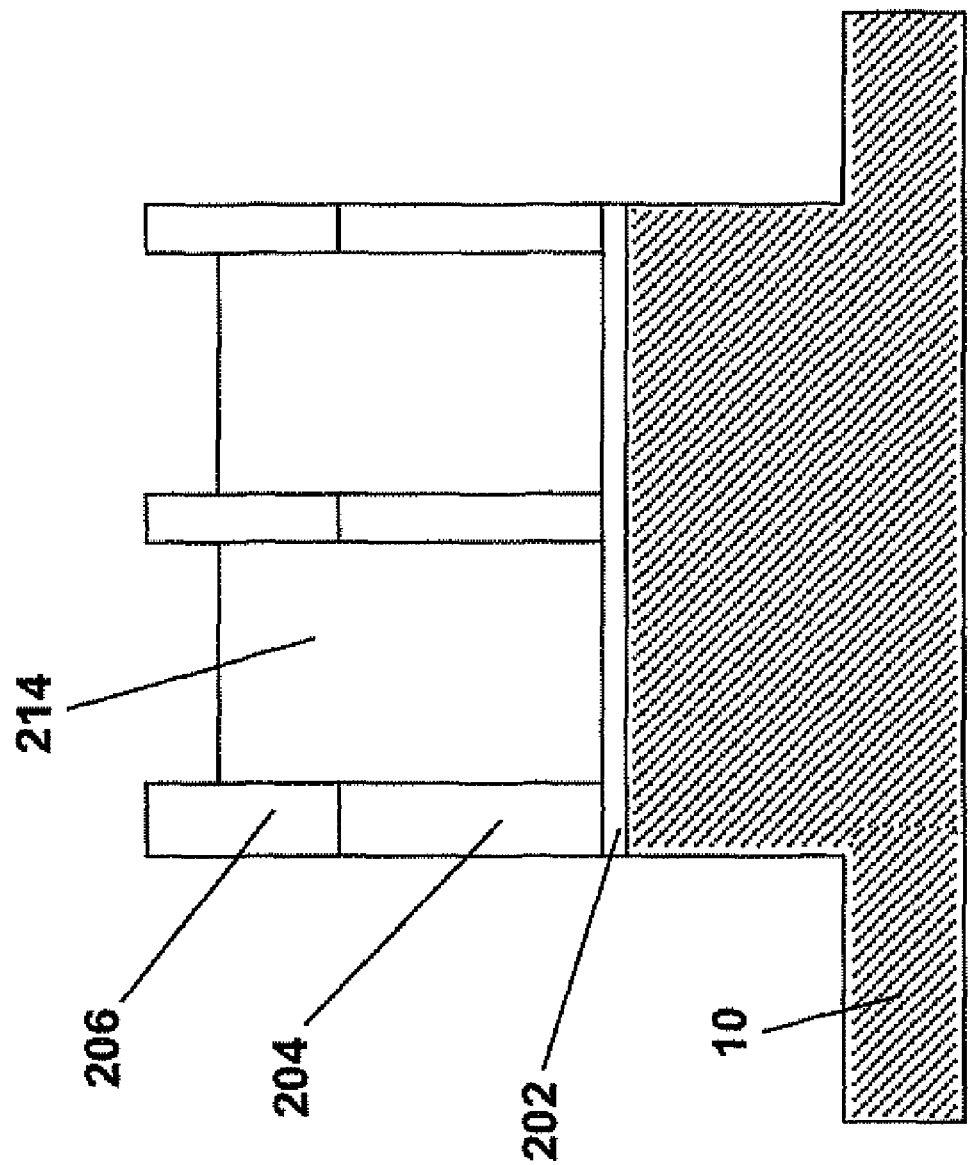
Figure 9A:
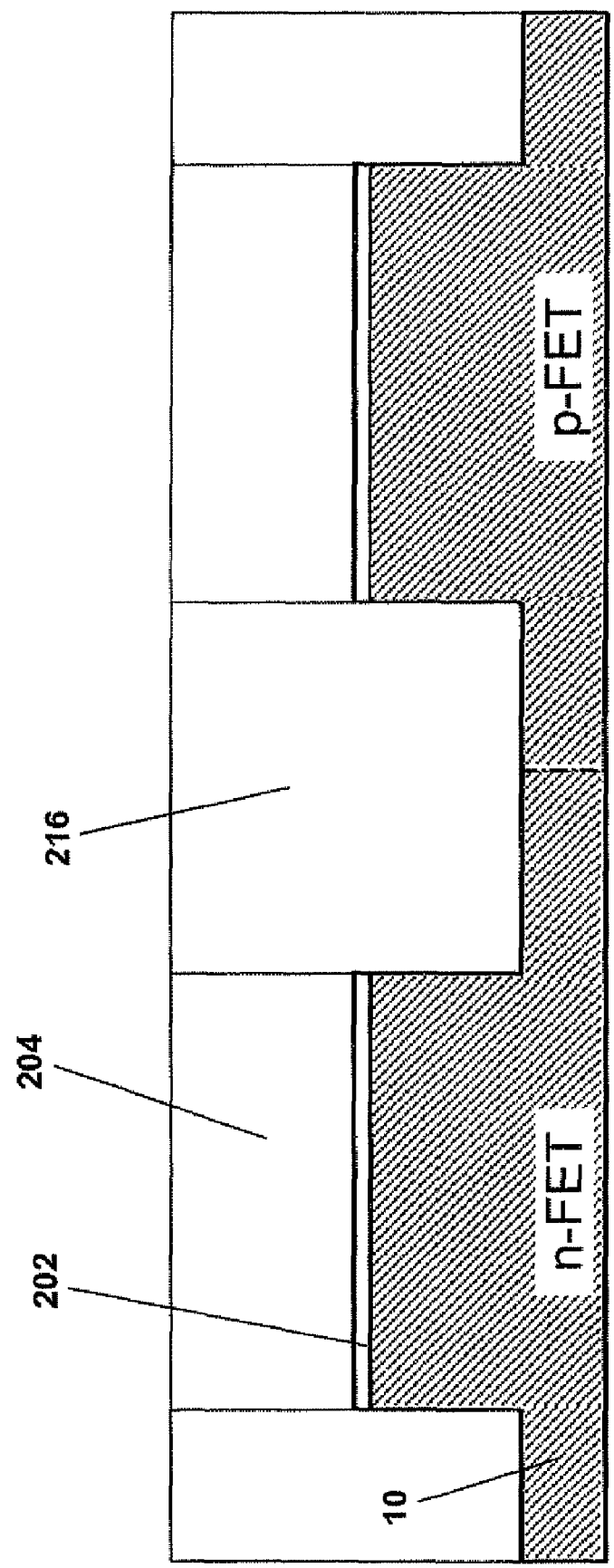
Figure 9B:
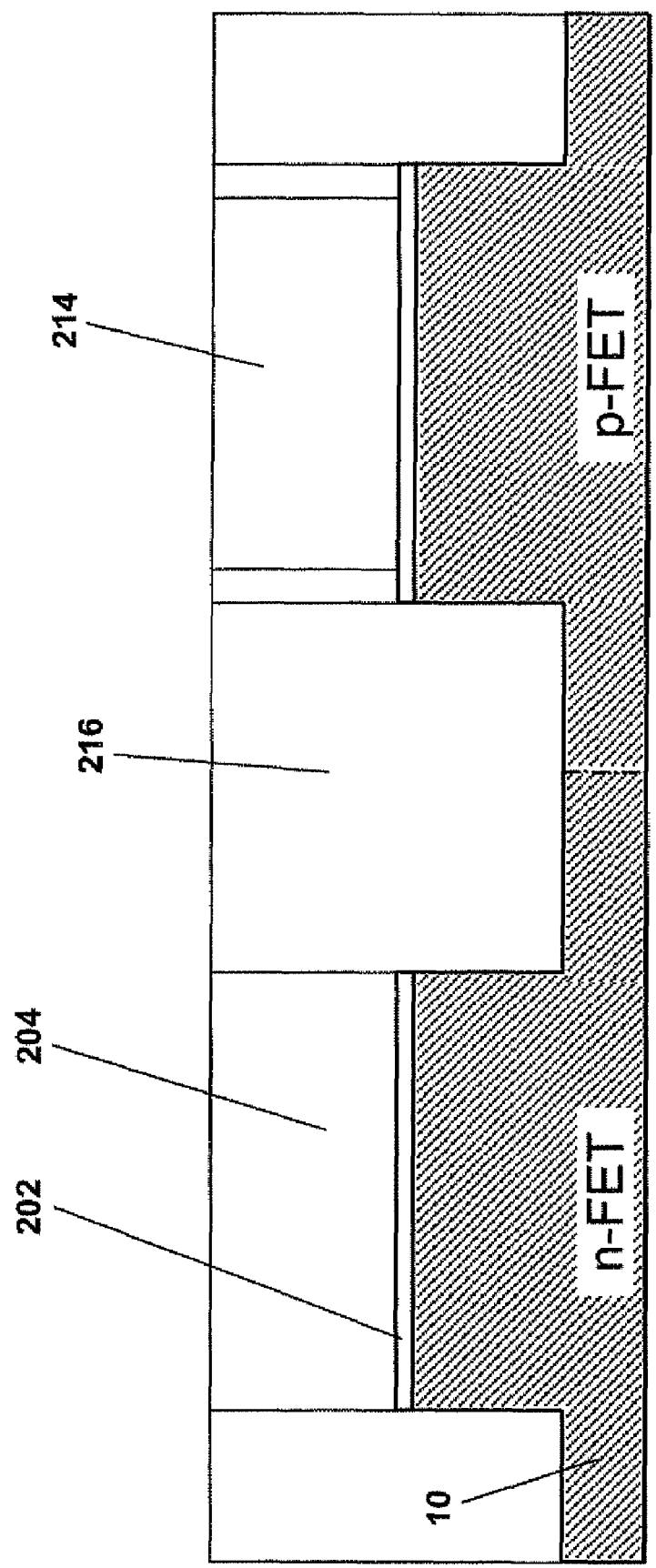
Figure 9C:
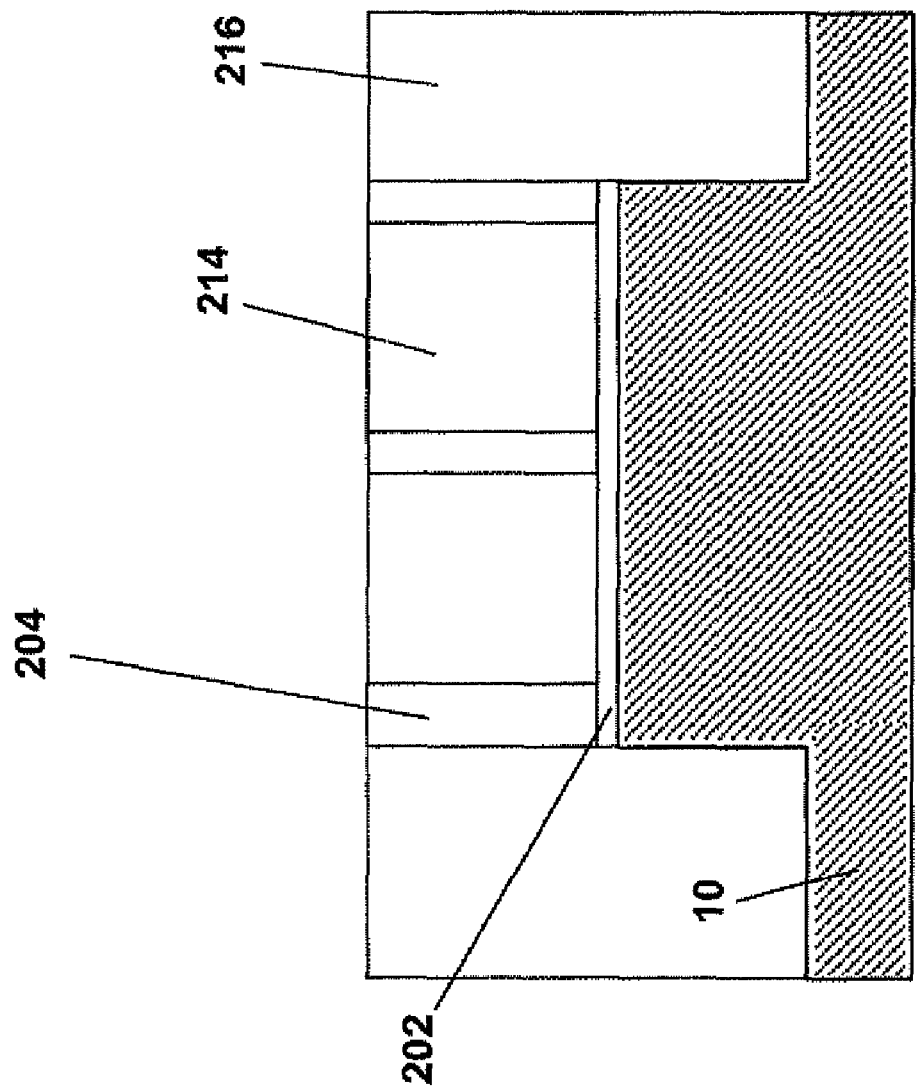

The semiconductor substrate 10 can be selectively etched back by RIE to form isolation trenches between the n-FET and the p-FET device regions, as shown in FIGS. 8A-8C. Next, an oxide material 216 is deposited over the entire structure to fill the isolation trenches, followed by chemical-mechanical polishing (CMP) that uses the nitride layer 204 as a CMP stop layer. Specifically, an upper portion of the deposited oxide material 216, the entire oxide cap layer 206, and an upper portion of the remaining SiGe layer 214 located between the trenches at the p-FET region are removed by CMP, as shown in FIGS. 9A-9C.

Figure 10A:
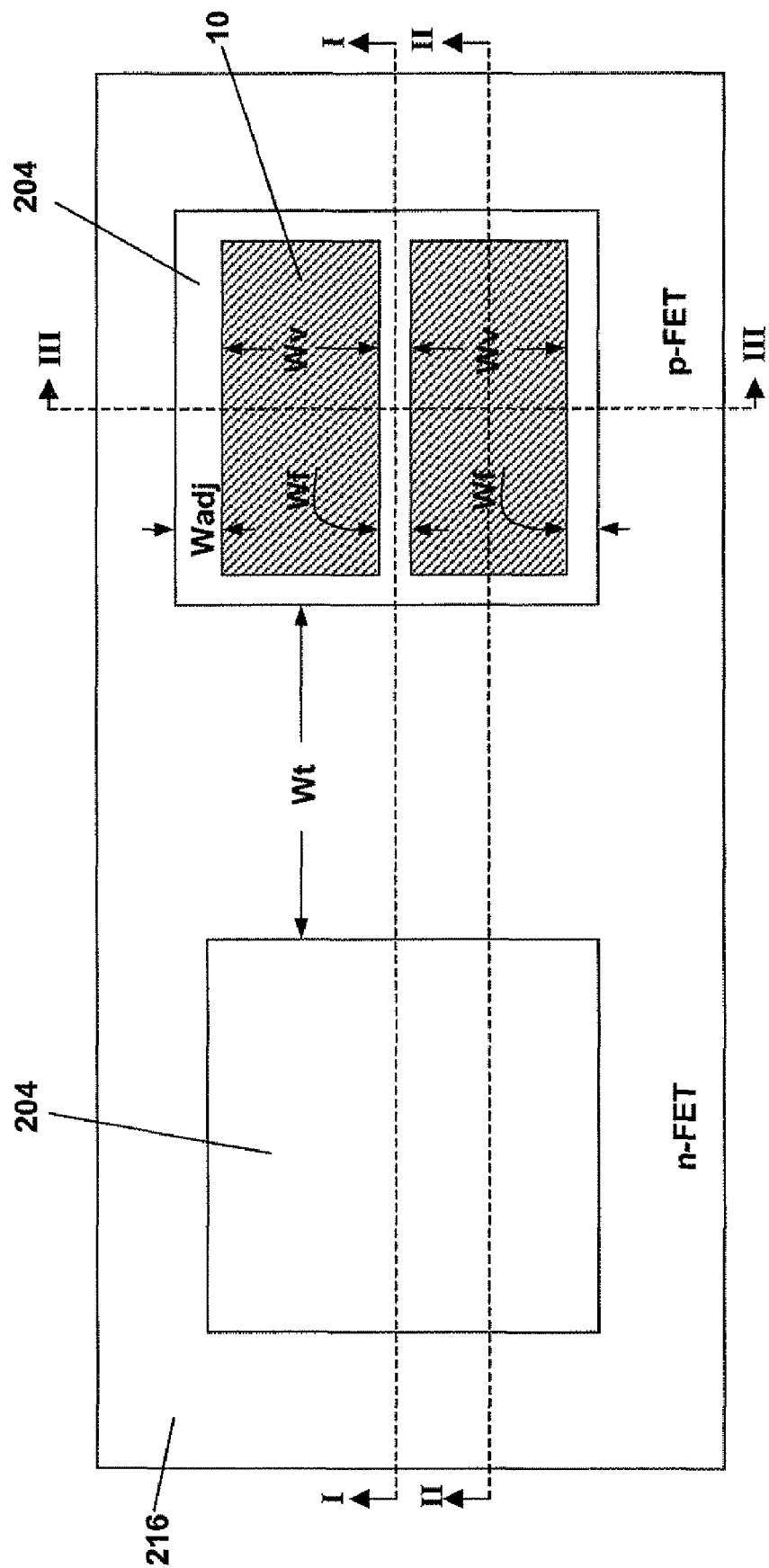
Figure 10B:
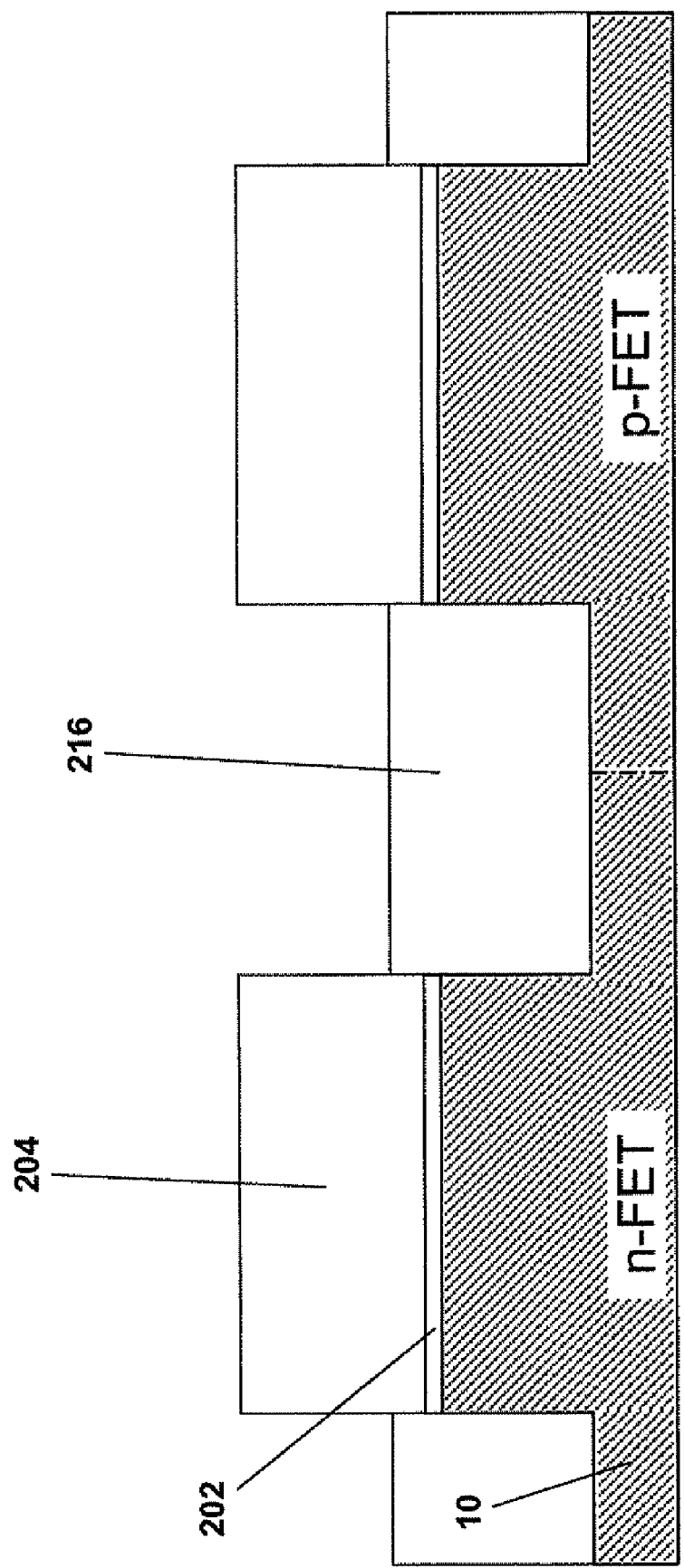
Figure 10C:
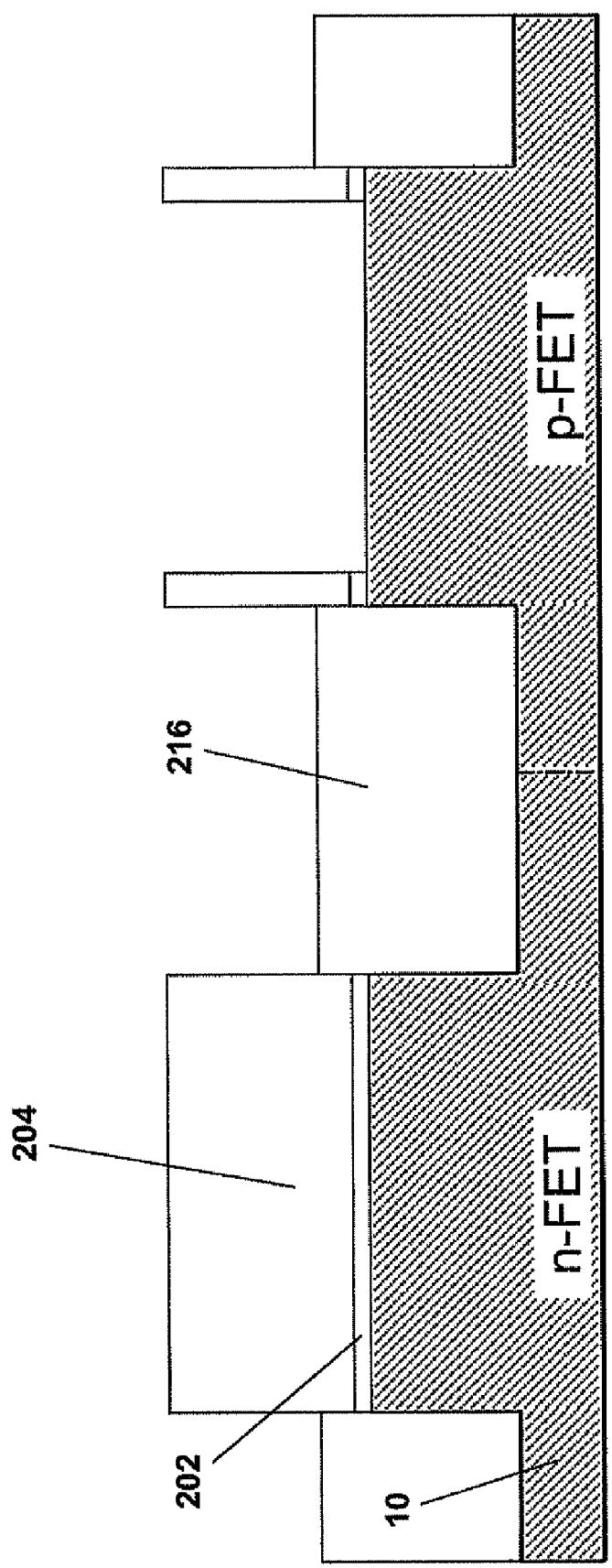
Figure 10D:
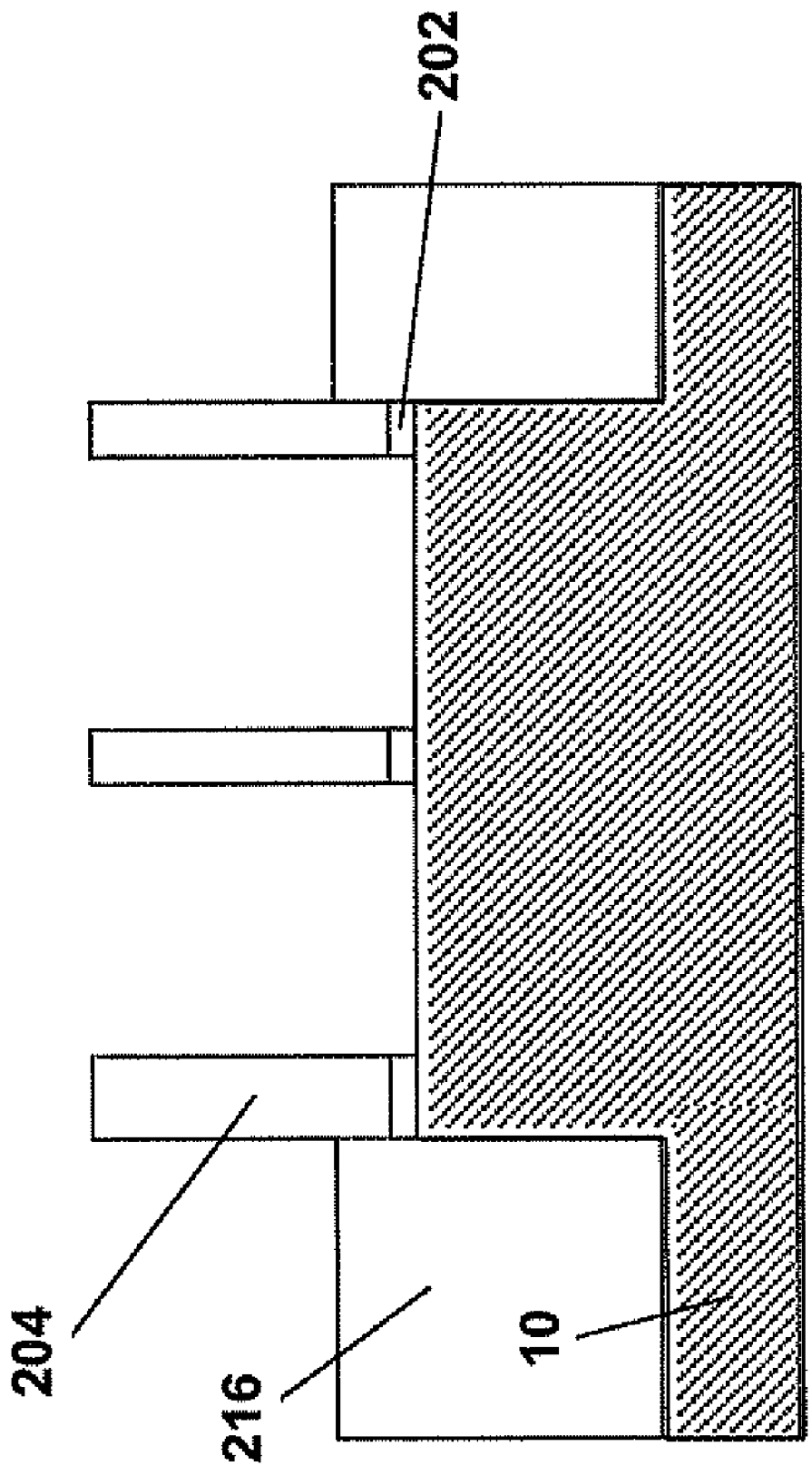

The remaining oxide material 216 is then selectively etched back to a level that is slightly above the thin pad oxide layer 202, followed by etching of the remaining SiGe layer 214 and etching of the exposed thin pad oxide layer 202 located in the trenches at the p-FET region. FIG. 10A shows a top view of the structure after the CMP, oxide etching, SiGe etching, and pad oxide etching. On one hand, the n-FET active region is completely covered by the nitride layer 204, which functions as a stop layer during the CMP and a protective mask layer during the oxide etching, the SiGe etching, and the pad oxide etching. On the other hand, the p-FET active region is only partially covered by the nitride layer 204, while the semiconductor substrate 10 located in the trenches at the p-FET active region becomes exposed. FIGS. 10B-10D show cross-section views of the structure in FIG. 10A along lines I-I, II-II, and III-III, respectively.

Preferably, but not necessarily, implantations are conducted at the p-FET device region to modulated the threshold voltages of the top and bottom edges of the p-FET with V-shaped trenches as a part of its channel. For example, the first doped layer can be used to adjust local threshold voltage near top part of the V-shaped trenches and the second doped layer to adjust local threshold voltage (independently to the first doped layer) near the bottom of the V-shaped trenches. Such an implantation is helpful for obtaining uniform threshold voltage in the entire channel. Specifically, a first implanted layer (not shown) with a relatively low dopant concentration is formed at a top portion of the semiconductor substrate 10 located between the trenches at the p-FET device region to control the top edge threshold voltage of the p-FET, and a second implanted layer (not shown) with a relatively high dopant concentration is formed at a bottom portion of the semiconductor substrate 10 located between the trenches at the p-FET device region to control the bottom edge threshold voltage of the p-FET. The first implanted layer (not shown) can be formed either by vertical implantation, which forms an implanted layer that is aligned with the trenches at the p-FET device region, or by angled implantation, which forms an implanted layer that extends from the trenches to underneath the nitride layer 204 and the thin pad oxide layer 202. The second implanted layer (not shown) is preferably formed by a vertical implantation step.

Figure 11A:
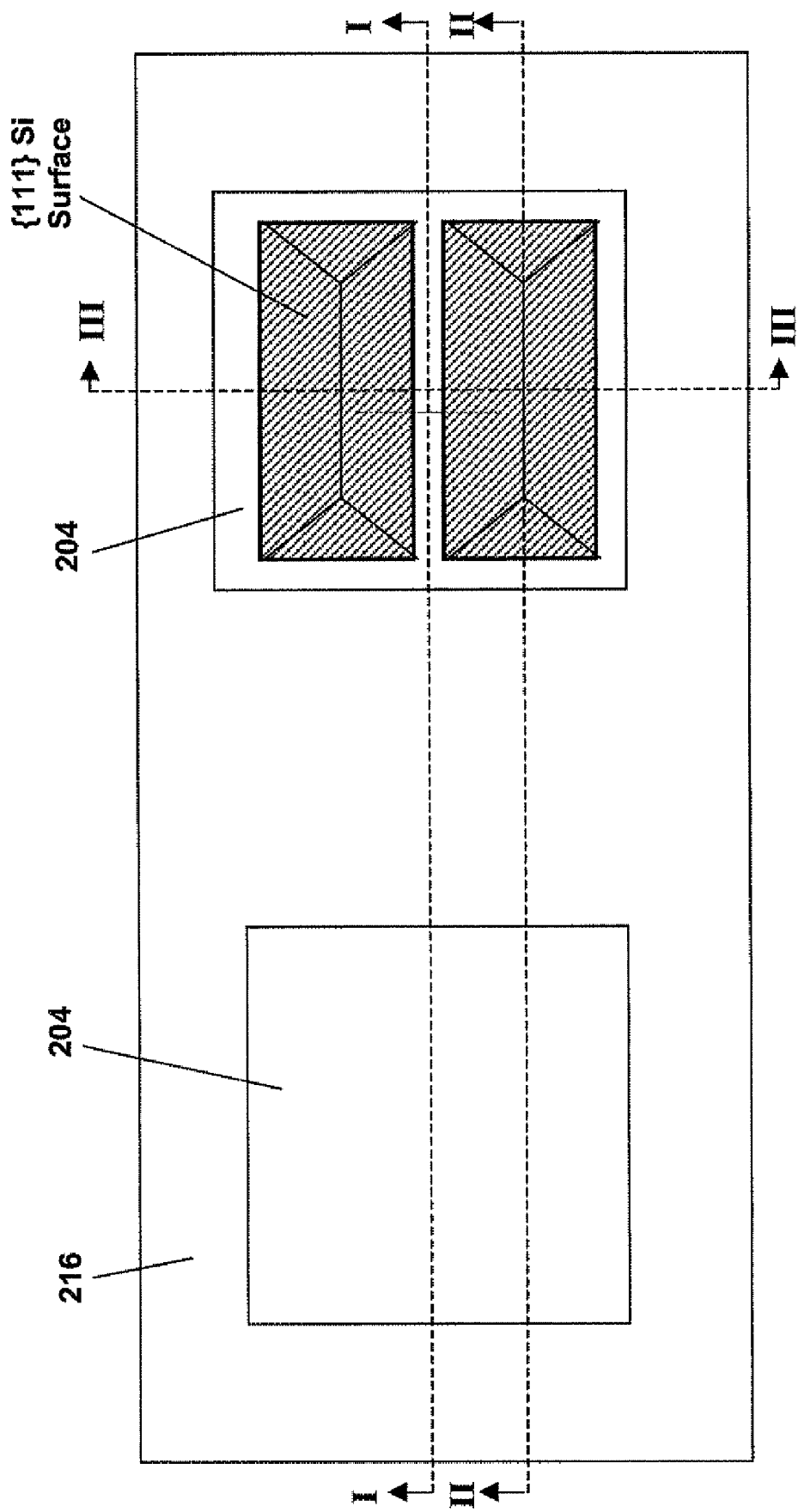
Figure 11B:
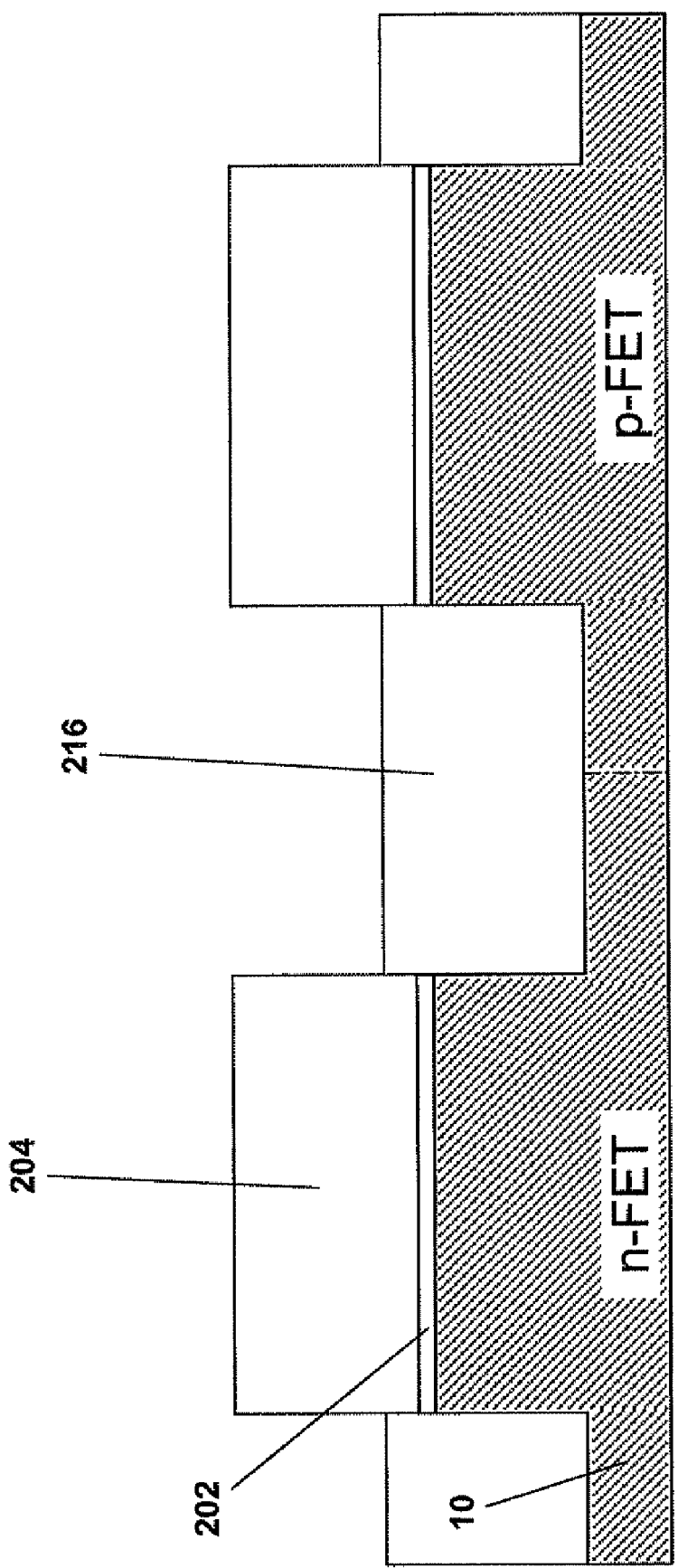
Figure 11C:
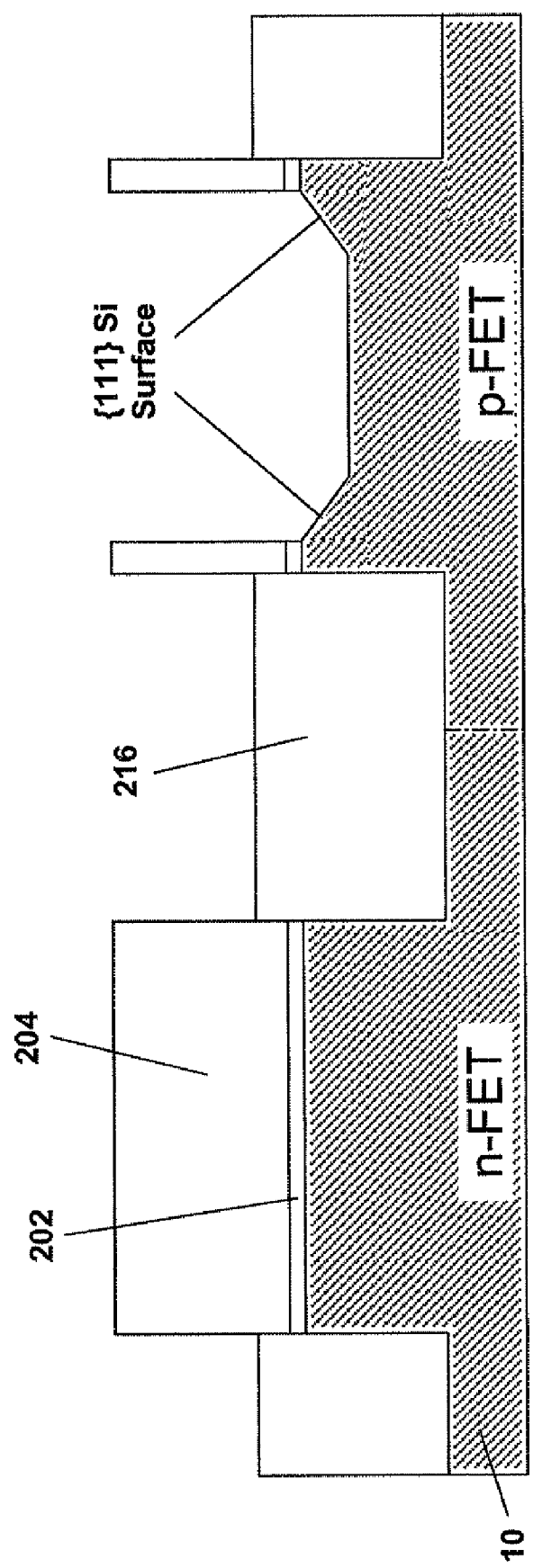
Figure 11D:
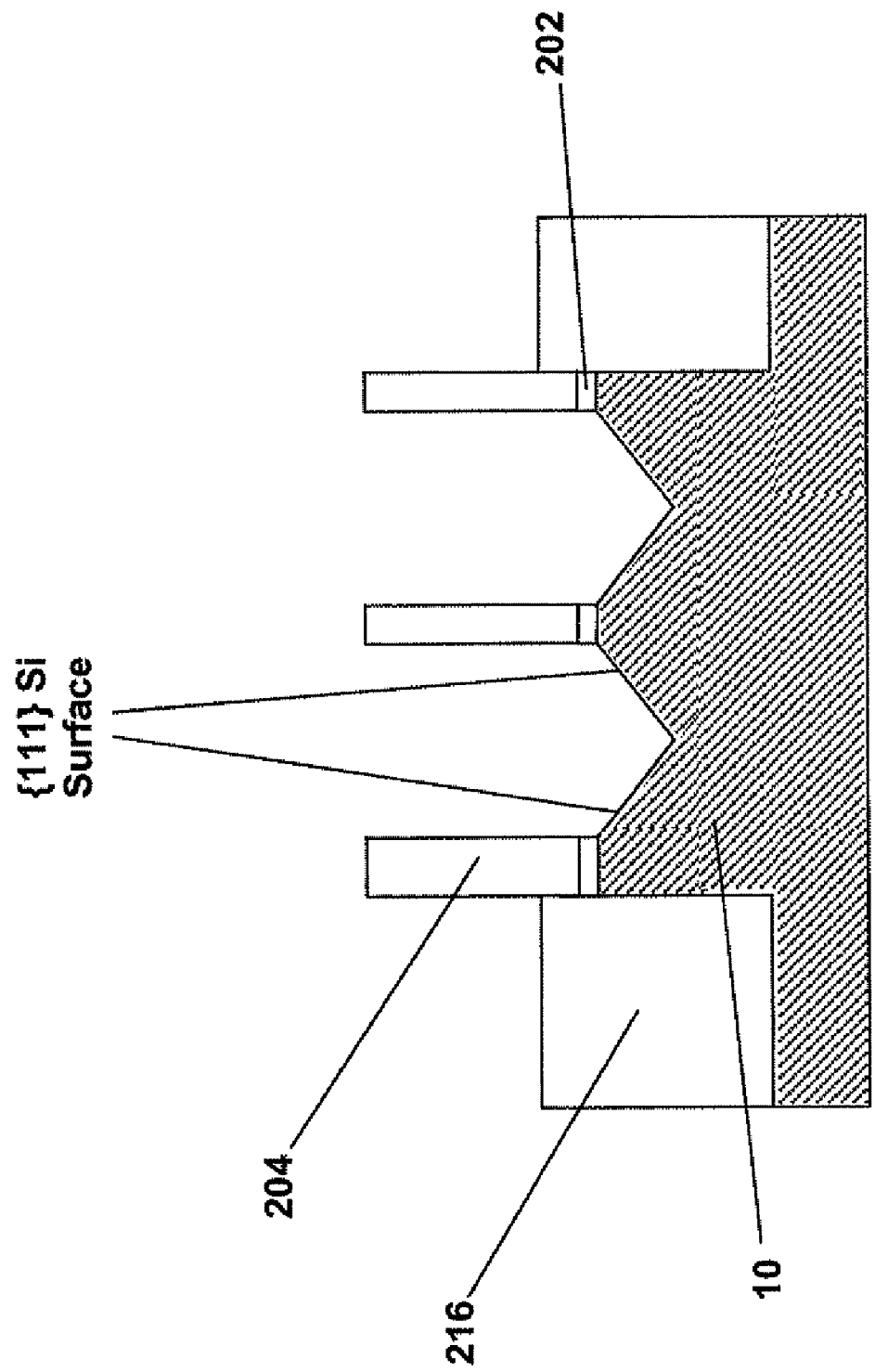

Next, a crystallographic etching step as described hereinabove is carried out to selectively etch the exposed surface of the semiconductor substrate 10 in the trenches at the p-FET active region. The crystallographic etching step is preferably, but not necessarily, conducted using a diluted ammonia- or TMAH-based etching solution, which etches the {100} planes of silicon at a rate faster than the {111} planes of silicon, thereby forming multiple parallel arranged V-shaped trenches with interior surfaces oriented along the {111} planes of silicon at the p-FET device region, as shown by the top view in FIG. 11A. FIGS. 11B-11D show respective cross-sectional views of the structure in FIG. 11A along lines I-I, II-II, and III-III. As mentioned hereinabove, trenches with interior surface orientations other than the {111} planes of silicon can also be formed, depending on the specific semiconductor substrate, the initial surface orientation of the semiconductor substrate, and the etching chemistry used.

Figure 12A:
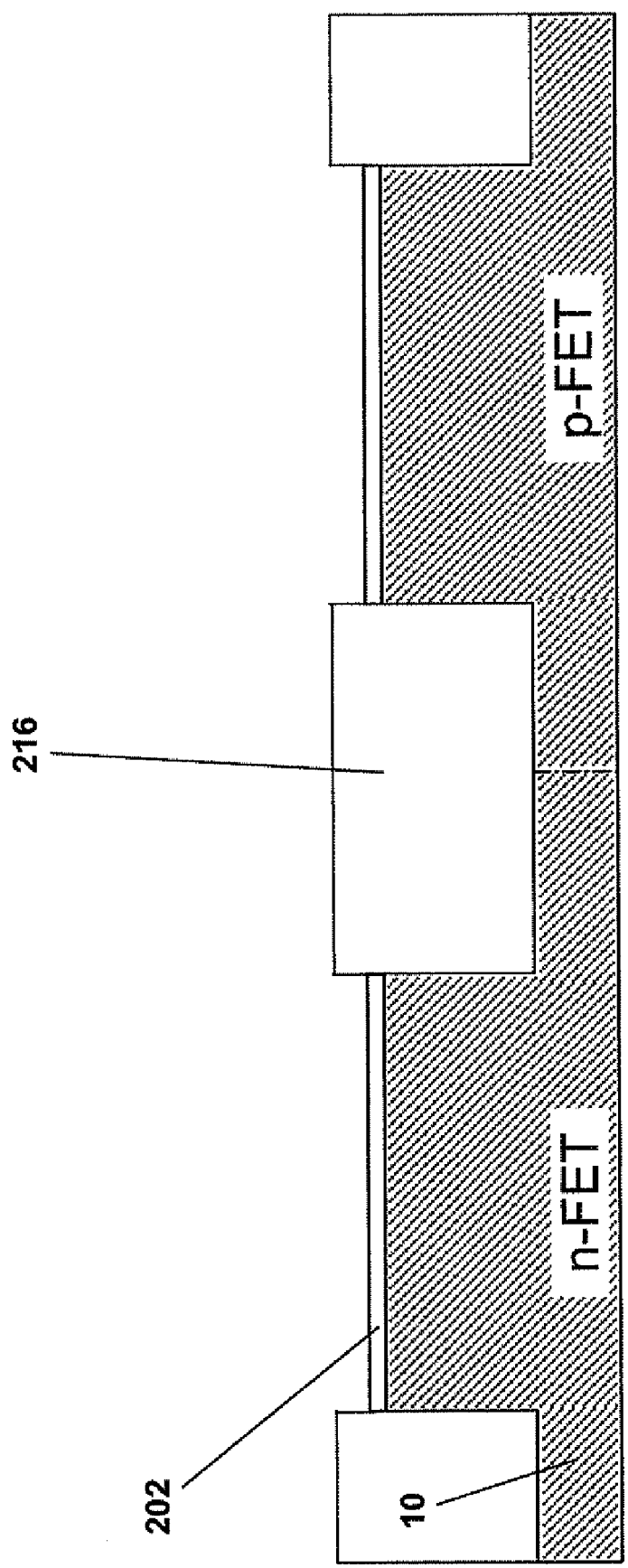
Figure 12B:
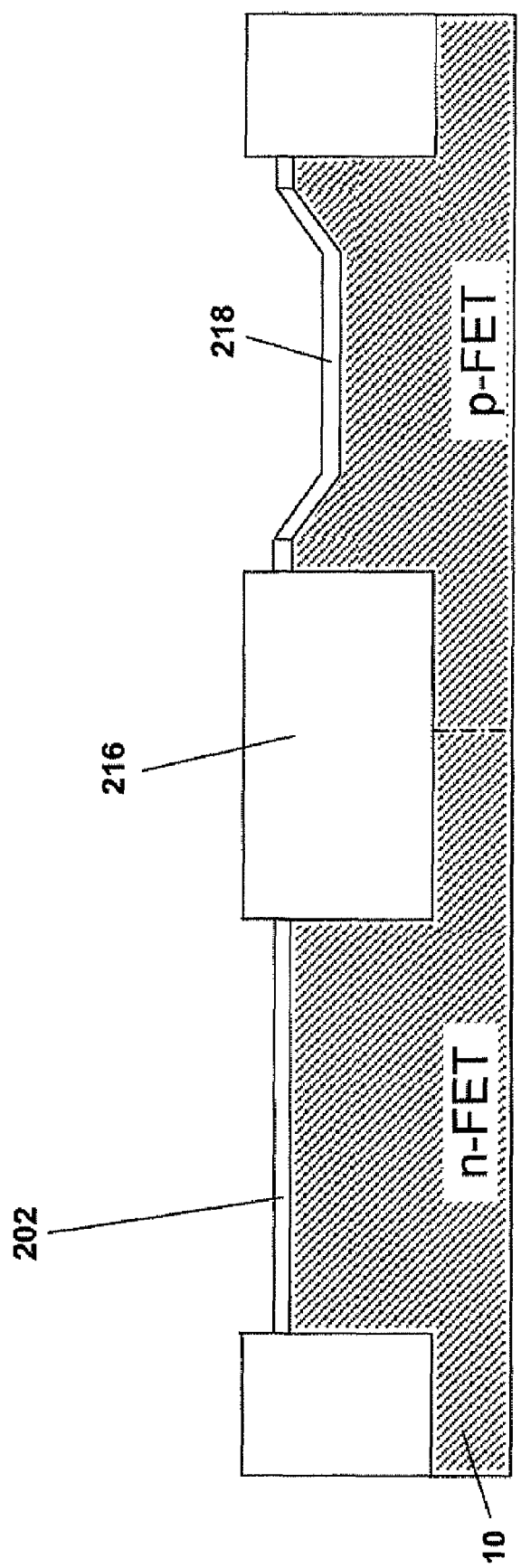
Figure 12C:
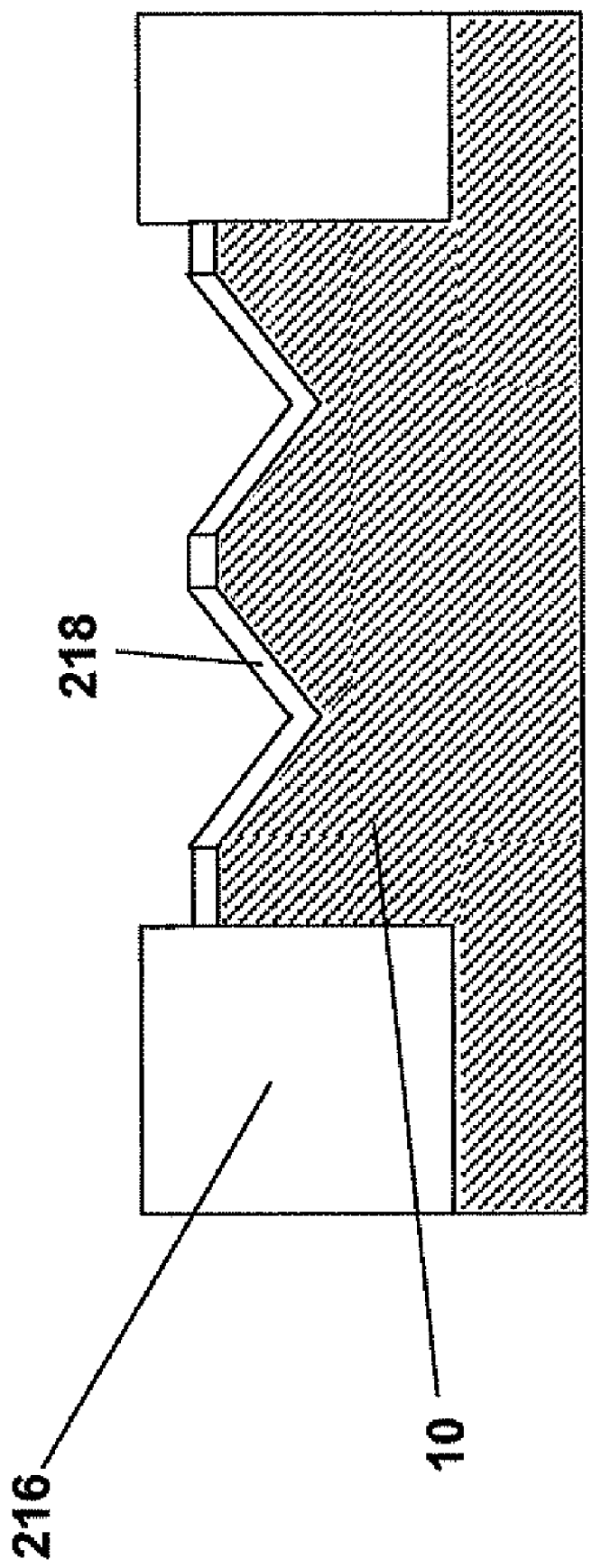
Figure 13:
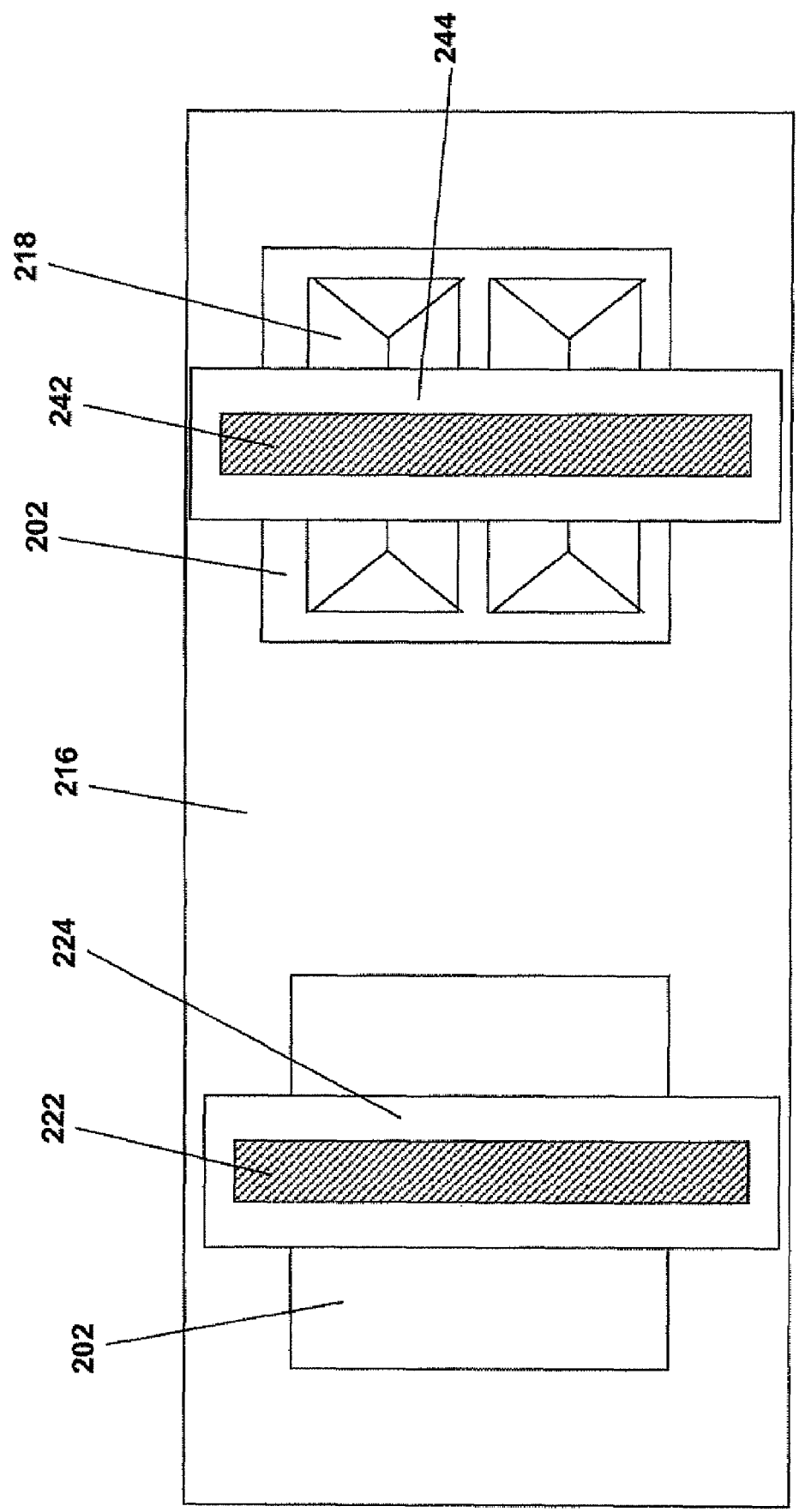

Thermal oxidation can be carried out to subsequently form a thin oxide layer 218 over the formed V-shaped trenches at the p-FET device region, followed by selective etching of nitride over oxide to form a structure as shown in FIGS. 12A-12C. The selective etching of nitride over oxide is preferably conducted using a wet etching solution containing phosphoric acid at an elevated temperature ranging from about 100° C. to about 200° C. In order to protect the subsequently formed thin oxide layer 218 during the selective nitride etching process, additional nitride can optionally be deposited to refill the trenches at the p-FET device region prior to the selective nitride etching.

Conventional CMOS processing steps, which are not described herein in order to avoid obscuring the present invention, are then carried out to form complete n-FET and p-FET at the n-FET and p-FET device regions. A top-down view of such a structure is shown, for example, in FIG. 13. The complete n-FET includes a gate structure comprising a gate oxide layer 202 and a patterned gate conductor 222 with dielectric spacers 224 extending across the planar surface of the n-FET device region. The n-FET gate structure defines an n-FET channel region (not shown) that is located in the semiconductor substrate 10 underlying the gate oxide layer 202 and n-FET source and drain regions (not shown) that are located in the underlying semiconductor substrate 10 at opposite sides of the channel region (not shown). The complete p-FET includes a similar gate structure comprising a gate oxide layer 218 and a patterned gate conductor 242 with dielectric spacers 244 extending across the multiple parallel arranged V-shaped trenches at the p-FET device region. The p-FET gate structure also defines a p-FET channel region (not shown) located in the semiconductor substrate 10 underlying the gate oxide layer 218 and p-FET source and drain regions (not shown) located in the underlying semiconductor substrate 10 at opposite sides of the channel region (not shown).

As mentioned hereinabove, the gate structure of the p-FET, which defines the channel (not shown) of the p-FET, extends across the multiple parallel arranged V-shaped trenches at the p-FET device region. In this manner, the gate structure or channel of the p-FET does not have to be aligned longitudinally with any one of the V-shaped trenches, which lowers the alignment requirements during the gate fabrication process and thereby reduces the manufacturing complexity. Further, the gate or channel length of the p-FET is not limited by, and may be multiple times greater than, the width of a single V-shaped trench. Therefore, the gate or channel length of the p-FET can be readily adjusted to achieve better device performance.

Note that in the exemplary CMOS device structure formed by the processing steps illustrated in FIGS. 2-13, the n-FET and p-FET active device regions are isolated from each other by dielectric or insulator structures 216 having rectangular bottom portions. In an alternative embodiment, a single device region, including either an n-FET or p-FET, having at a channel region comprising the least one V-shaped trench is also contemplated. In yet another alternative embodiment of the present invention, the n-FET and p-FET active device regions can also be isolated from each other by dielectric or insulator structures that have V-shaped bottom portions. This aspect of the present invention is now described in more detail.

Figure 14A:
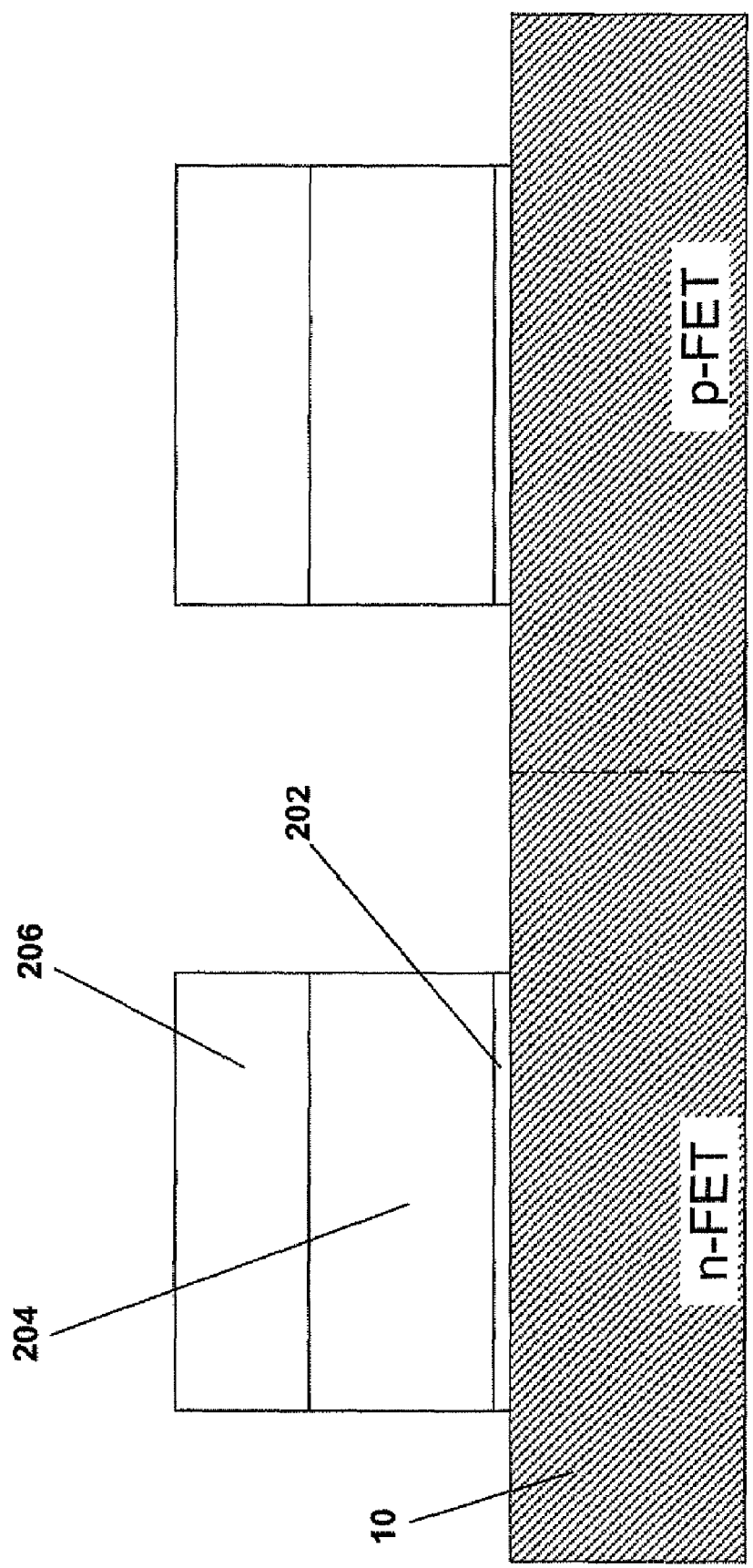
FIGS. 14A-16C illustrate alternative processing steps for forming a CMOS device similar to that in FIG. 1, except that the isolation regions of this CMOS device include isolation structures with V-shaped bottom portions.
Figure 14B:
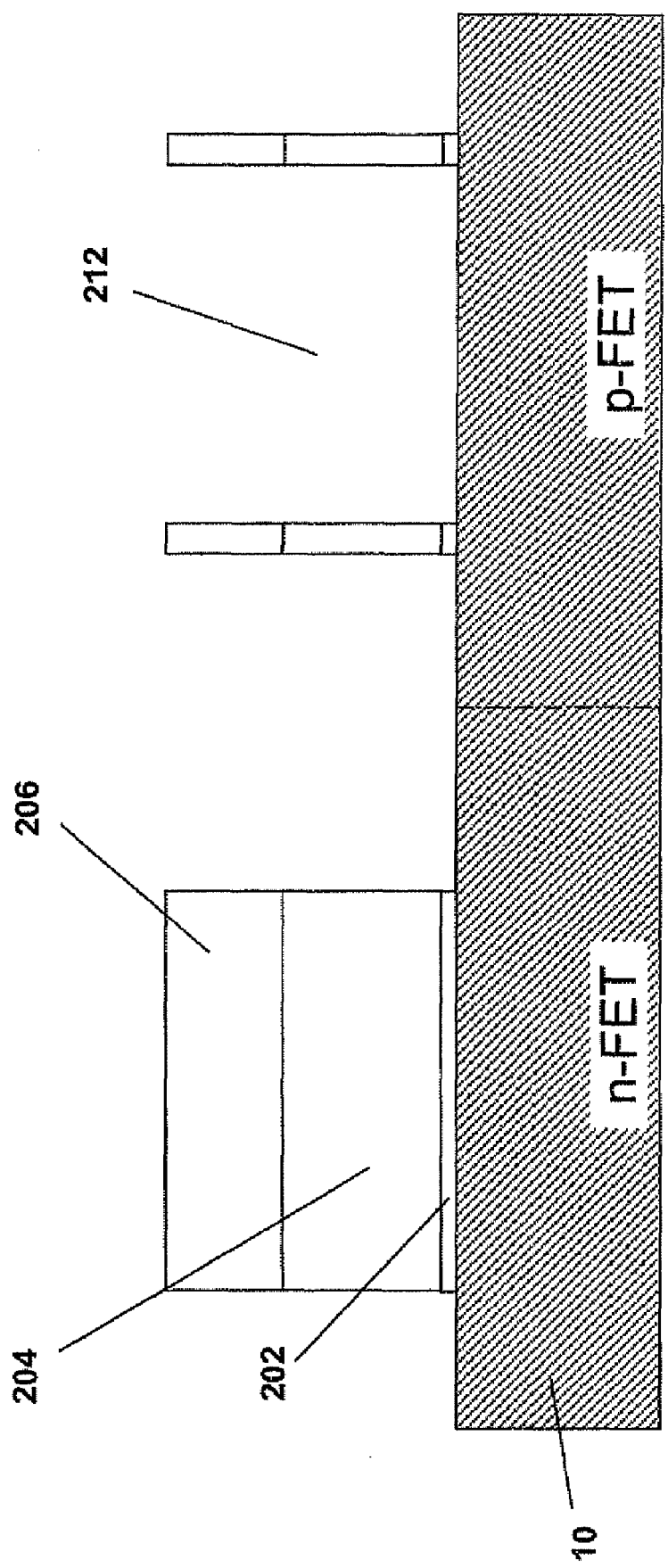
Figure 14C:
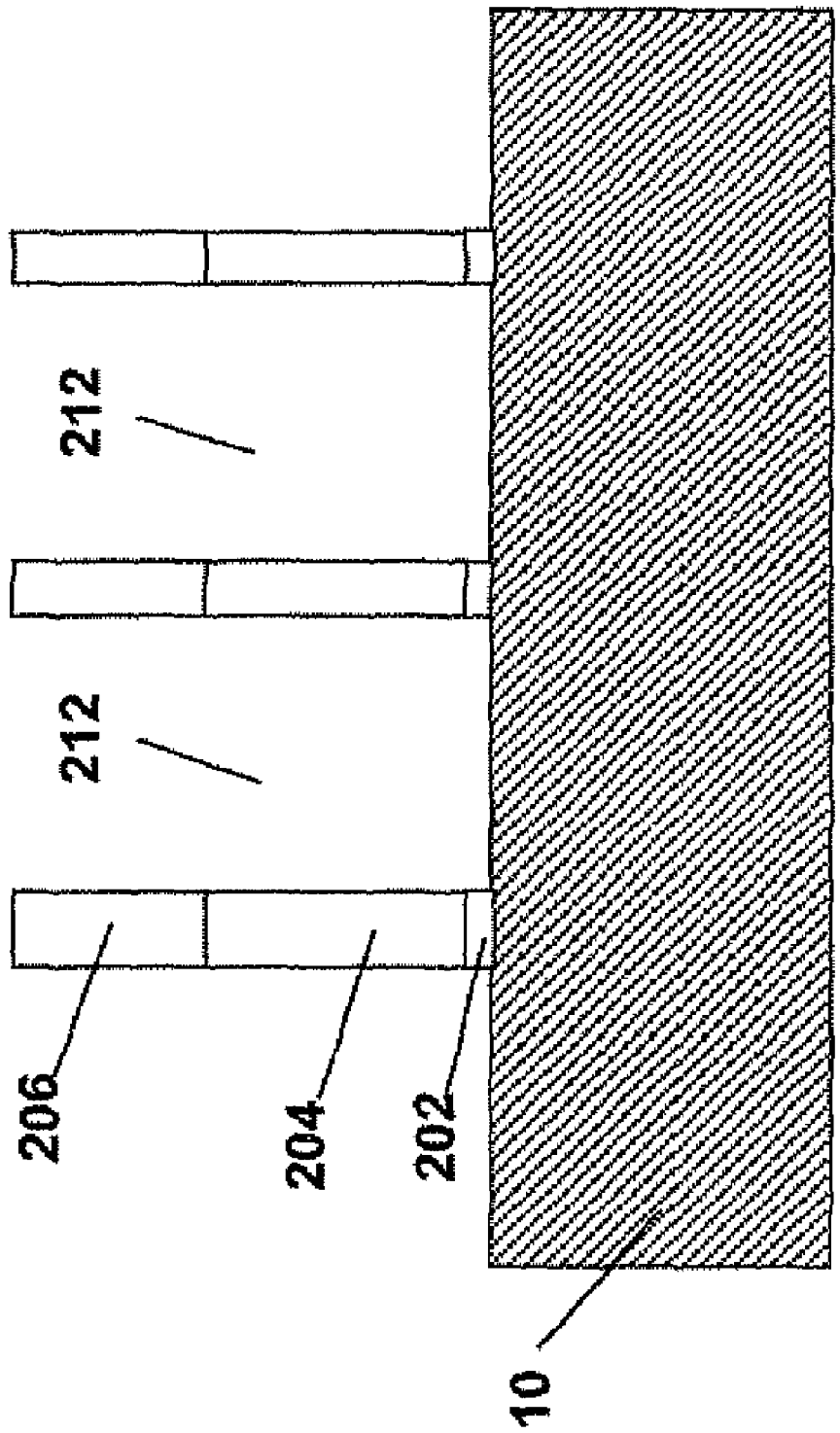
Figure 15A:
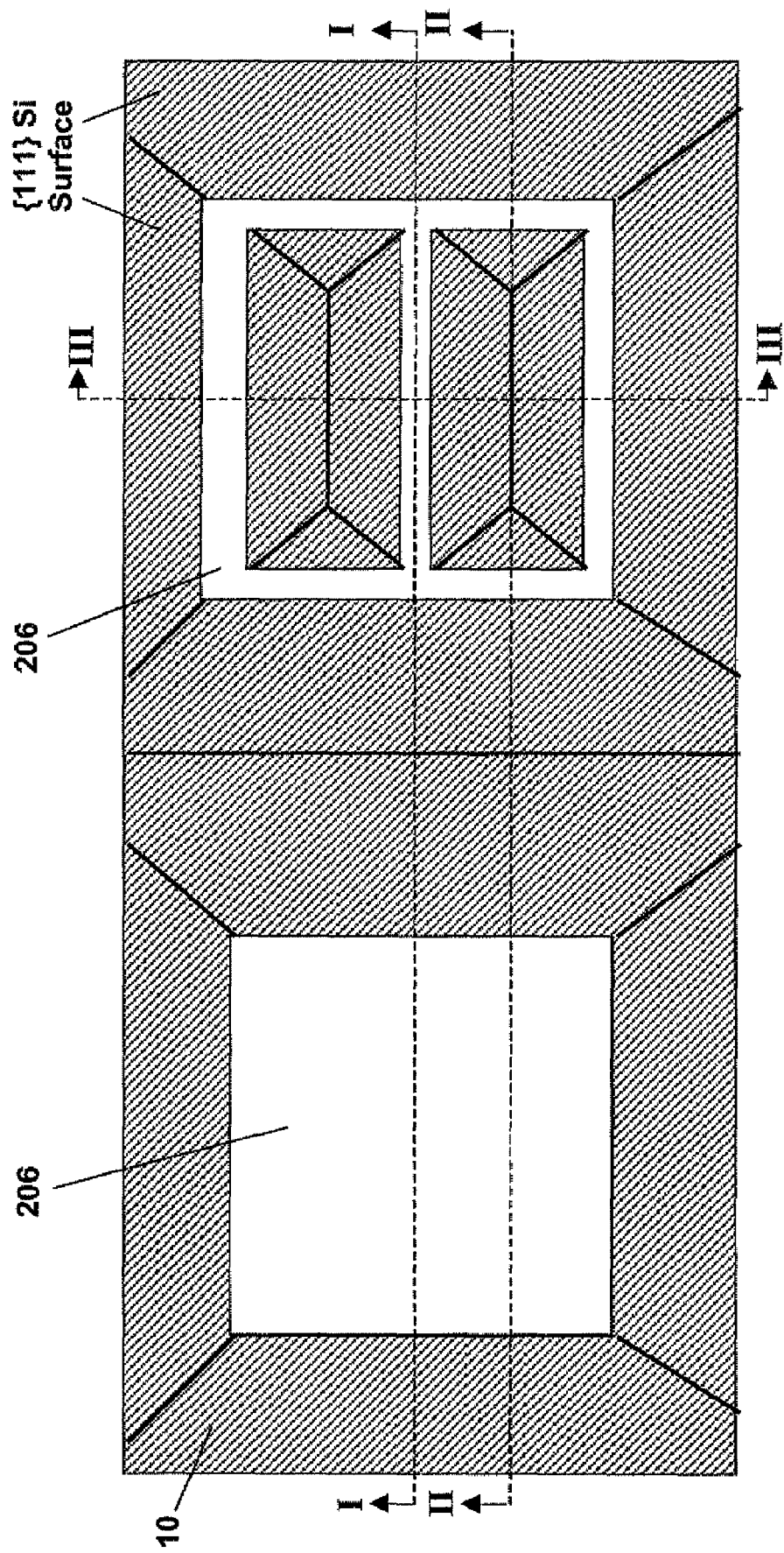
Figure 15B:
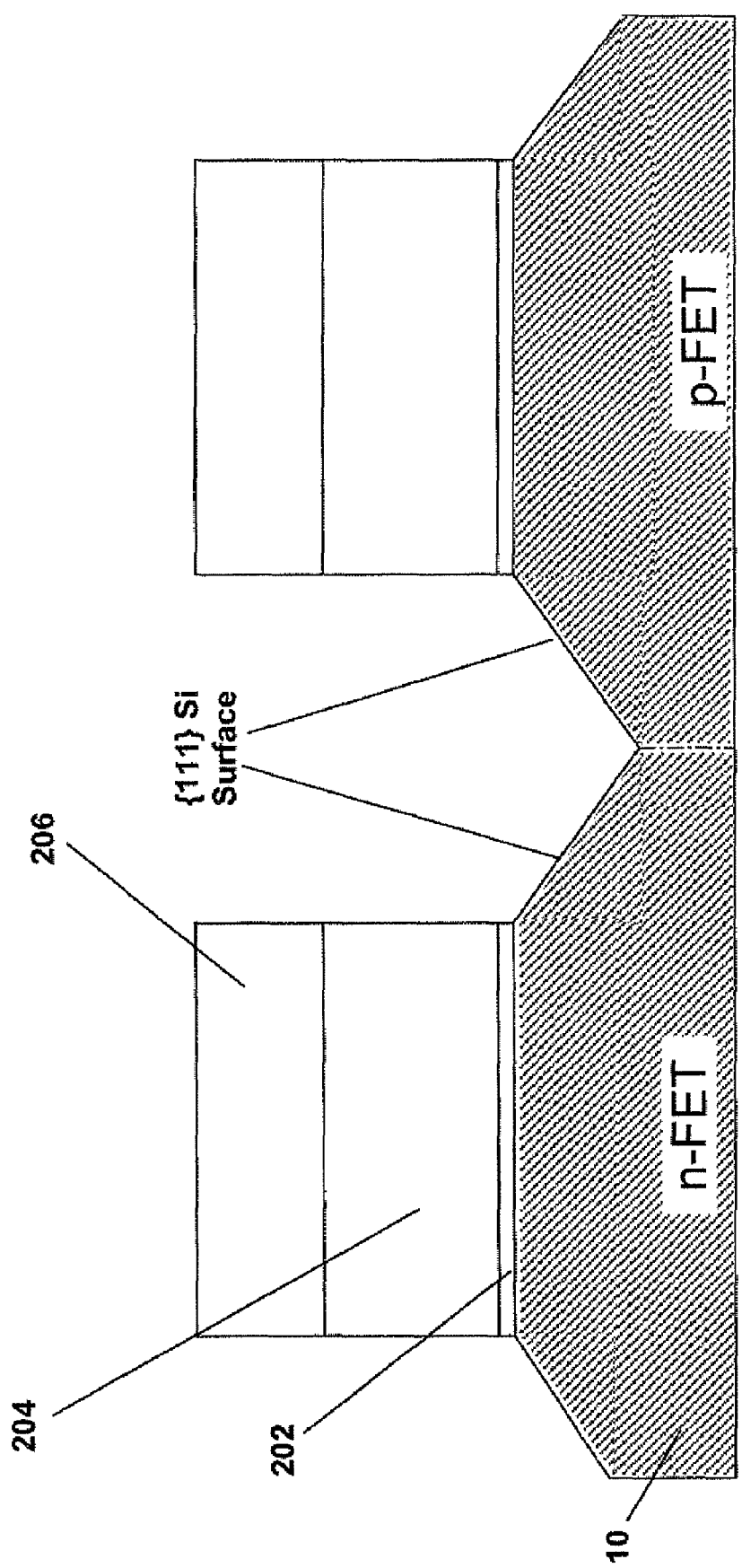
Figure 15C:
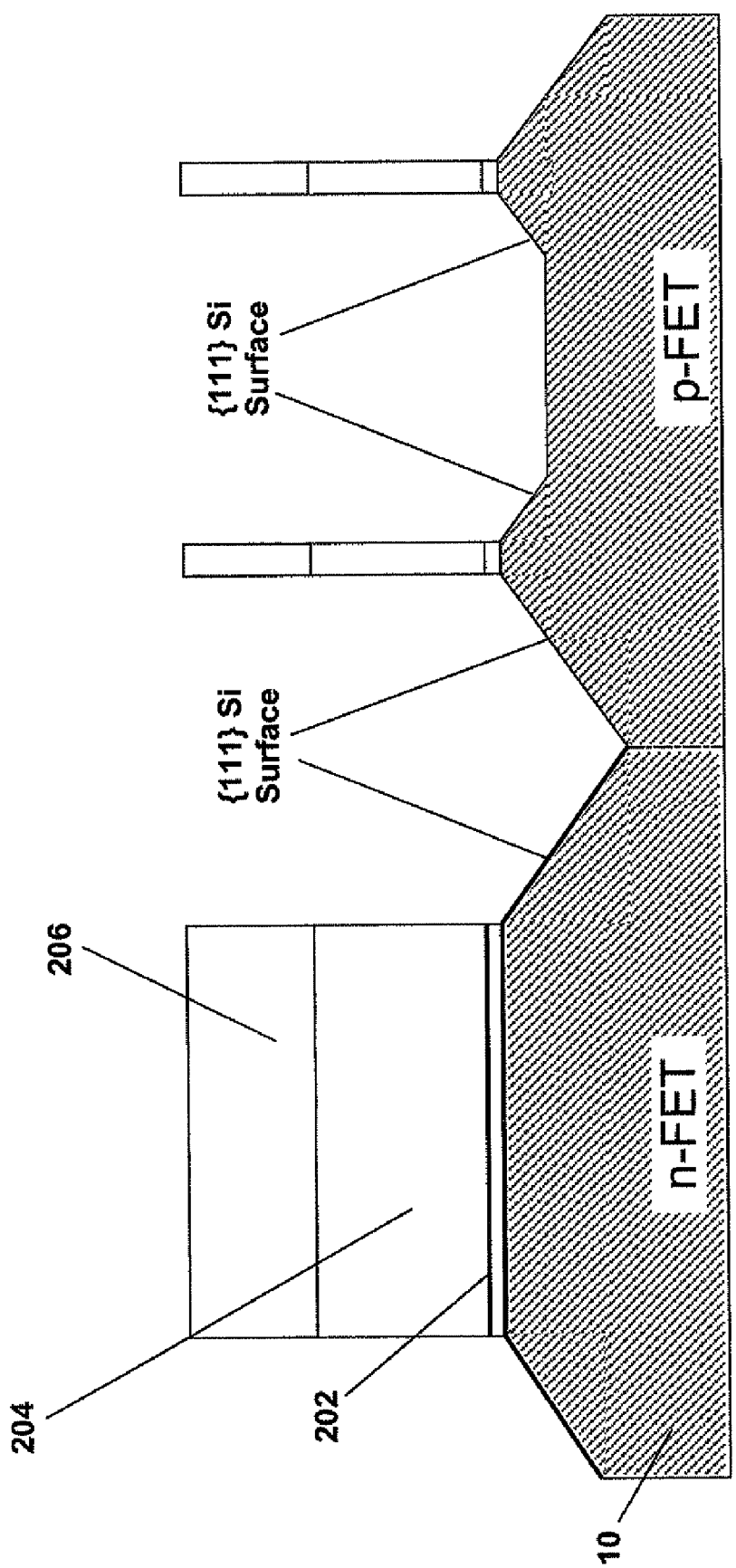
Figure 15D:
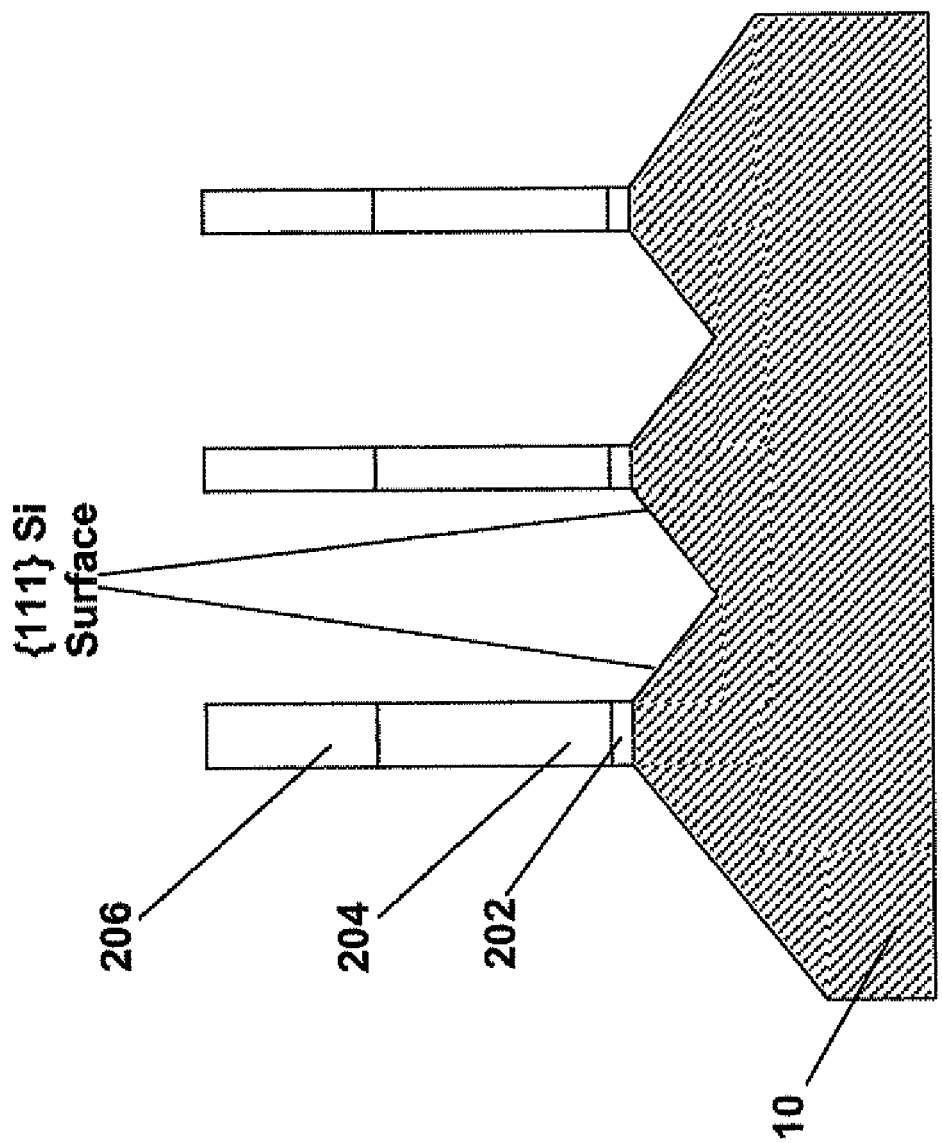

This aspect of the present invention begins by first providing the structure shown in FIGS. 14A-14C. It is noted that the structure shown in FIGS. 14A-14C is the same as that shown in FIGS. 5B-5D and, as such, the elements and processing details used in forming the structure shown in FIGS. 5B-5D applied for this aspect of the present invention as well.

After providing the structure shown in FIGS. 14A-14C, a crystallographic etching step (as described hereinabove) is carried out for selectively etching the exposed portions of the semiconductor substrate 10. The etching step forms a V-shaped trench between the device regions as well as narrow V-shaped trenches in the n-FET device region. Preferably, but not necessary, the crystallographic etching step is carried out using a wet-etching process, which employs a hydroxide-based etching solution that etches the {110} planes at a rate much faster than the {100} planes. The trenches so formed therefore has a substantially triangular cross-section and contains interior surfaces that are substantially aligned in the {111} crystal planes The resultant structure is shown in FIGS. 15A-15D.

Figure 16A:
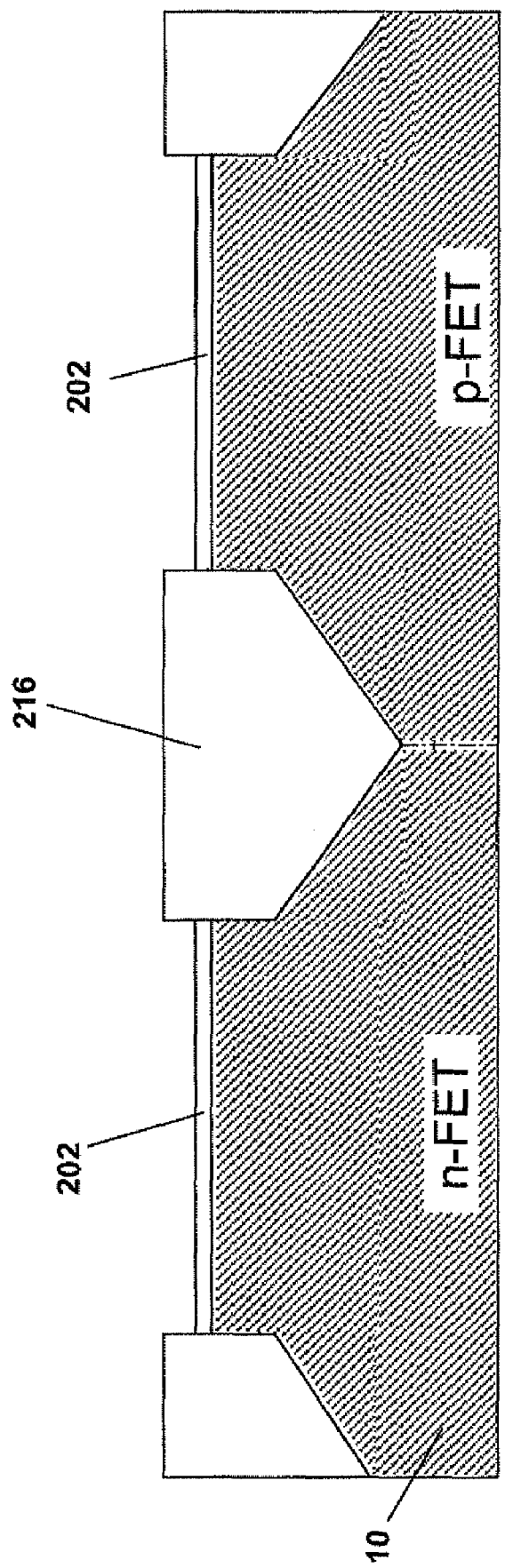
Figure 16B:
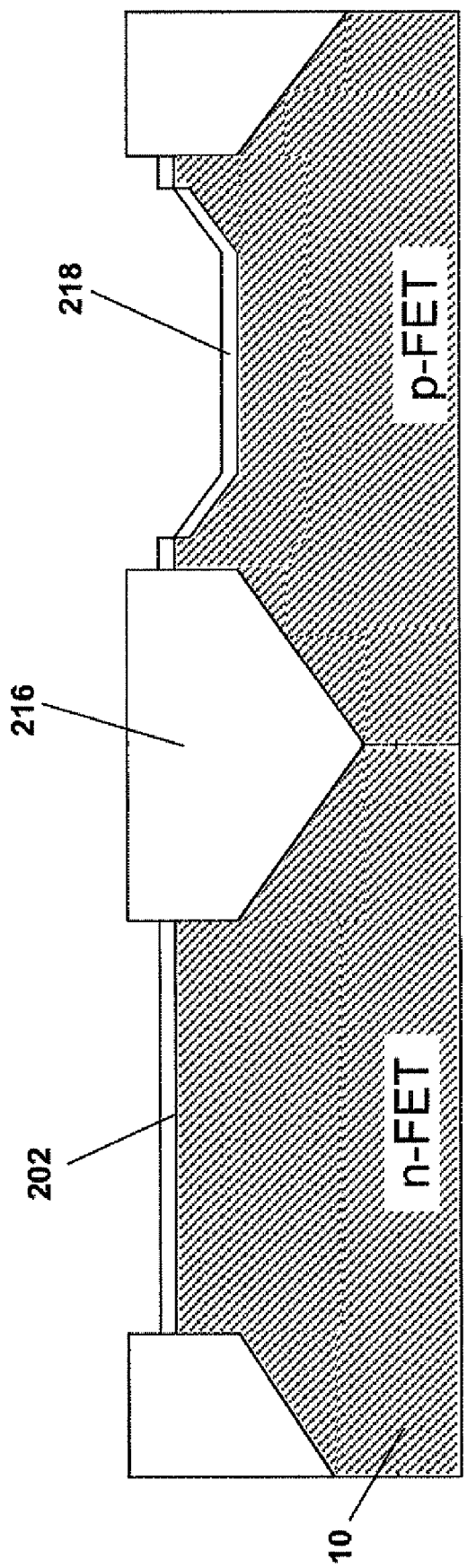

FIGS. 16A-16C illustrates the structure after further processing steps have been performed. In particular, FIG. 16A illustrates the structure after forming a sacrificial thermal oxide (not shown) on the exposed surfaces of the substrate 10, deposition of a conformal SiGe layer (not shown) on the structure (the conformal SiGe fills the gaps of the narrow V-shaped trenches, but not that of the wide V-shaped trench between the device regions), etching back the SiGe layer selective to oxide and nitride which exposes the sacrificial oxide within the V-shaped trench between the device regions, but not the narrow V-shaped trenches, removing the sacrificial oxide from the wide V-shaped trench between the device regions, filling the now exposed wide V-shaped trench with a trench oxide 216, etching back the trench oxide and etching all SiGe and nitride from the structure. A detailed discussion of each of these individual steps can be found in the disclosure presented herein above. It is noted that FIGS. 16B and 16C show the presence of the gate oxide 218 covering the surfaces of the narrow V-shaped trenches.

Subsequently, conventional CMOS processing steps, which are not described herein in detail, can be carried out to form a complete CMOS circuit containing a p-FET at the p-FET device region and an n-FET at the n-FET device region.

Although the above-illustrated drawings describe only exemplary device structures and exemplary processing steps for forming such device structures, it is readily understood that the present invention is not limited to such exemplary device structures and processing steps and is broadly applicable to other device structures and other processing steps, consistent with the principles as described hereinabove for the present invention. For example, the n-FETs and/or p-FETs may comprise stress-inducing structures or elements, such as dual stress liners and embedded SiGe or Si:C source/drain, to create desired tensile or compressive stress in the channel regions of the n-FETs or p-FETs for further improving the electron or hole mobility therein. For another example, well implantation can be provided in to adjust the threshold voltage (Vt) at the top and bottom edges of the p-FETs.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device, comprising:

forming a semiconductor substrate comprising first and second device regions that are isolated from each other by an isolation region, wherein the first device region has a planar surface with a first crystalline orientation, the second device region has a second crystalline orientation which is different from said first crystalline orientation, and the isolation region is formed by crystallographic etching which etches the semiconductor substrate along the first crystalline orientation at a rate faster than along the second crystalline orientation, thereby forming an isolation trench having a V-shaped bottom, followed by filling the isolation trench with an insulator material to form an insulator structure having a V-shaped bottom portion, and wherein said crystallographic etching concurrently forms at least one V-shaped trench within the second device region which has interior surfaces with the second crystalline orientation;

forming a first field effect transistor (FET) at the first device region, wherein said first FET comprises a channel that extends along the planar surface of the first device region; and forming a second, complementary FET at the second device region, wherein said second FET comprises a channel that extends perpendicularly across the at least one V-shaped trench and along the interior surfaces of said at least one V-shaped trench, and wherein a dopant concentration near the top part of the at least one V-shaped trench is different from that near the bottom of the at least one V-shaped trench.

2. A method for forming a semiconductor device, comprising:

forming a semiconductor substrate comprising first and second device regions that are isolated from each other by an isolation region, wherein the first device region has a planar surface with a first crystalline orientation, and wherein the second device region comprises at least one V-shaped which has interior surfaces with a second, different crystalline orientation;

forming a first field effect transistor (FET) at the first device region, wherein said first FET comprises a channel that extends along the planar surface of the first device region; and forming a second, complementary FET at the second device region, wherein said second FET comprises a channel that extends perpendicularly across the at least one V-shaped trench and along the interior surfaces of said at least one V-shaped trench, and wherein a dopant concentration near the top part of the at least one V-shaped trench is different from that near the bottom of the at least one V-shaped trench.

3. The method of claim 2, wherein the isolation region is formed by anisotropic etching of the semiconductor substrate along a direction that is perpendicular to the substrate surface to form an isolation trench having a rectangular bottom, followed by filling the isolation trench with an insulator material to form an insulator structure having a rectangular bottom portion.

4. The method of claim 3, wherein after formation of the isolation structure, the at least one V-shaped trench at the second device region are formed by crystallographic etching, which etches the semiconductor substrate along the first crystal orientation at a rate faster than along the second, different crystal orientation.

5. The method of claim 4, wherein the second device region is protected by dielectric mask structures and SiGe structures during the anisotropic etching of the semiconductor substrate, and wherein the SiGe structures are selectively removed against the dielectric mask structures after the anisotropic etching but before the crystallographic etching.

6. The method of claim 2, wherein the isolation region is formed by crystallographic etching, which etches the semiconductor substrate along the first crystal orientation at a rate faster than along the second, different crystal orientation, thereby forming an isolation trench having a V-shaped bottom, followed by filling the isolation trench with an insulator material to form an insulator structure having a V-shaped bottom portion.

7. The method of claim 6, wherein the at least one V-shaped trench is concurrently formed at the second device region by the crystallographic etching before filling of the isolation trench.

8. The method of claim 7, wherein the isolation trench at the isolation region is deepened by subsequent anisotropic etching before filling of the isolation trench, and wherein the second device region is protected by dielectric mask structures and SiGe structures during said subsequent anisotropic etching, so that the multiple parallel arranged V-shaped trenches are not deepened.

9. The method of claim 2, wherein the first and second device regions are spaced apart from each other by a distance (Wt), wherein said at least one V-shaped trench comprises multiple parallel arranged V-shaped trenches which are located at the second device region, and each of said trenches has a trench width (Wv), wherein the parallel arranged V-shaped trenches are spaced from each other by a distance (Wf), and wherein Wt>Wv>Wf.

* * * * *